US011275882B1

United States Patent
Zhang et al.

(10) Patent No.: US 11,275,882 B1
(45) Date of Patent: Mar. 15, 2022

(54) SYSTEM, METHOD, AND COMPUTER PROGRAM PRODUCT FOR GROUP AND ISOLATION PREDICTION USING MACHINE LEARNING AND APPLICATIONS IN ANALOG PLACEMENT AND SIZING

(71) Applicant: Cadence Design Systems, Inc., San Jose, CA (US)

(72) Inventors: Wangyang Zhang, Allison Park, PA (US); Elias Lee Fallon, Allison Park, PA (US); Regis R. Colwell, Gibsonia, PA (US); Hua Luo, Pittsburgh, PA (US); Namita Bhushan Rane, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 73 days.

(21) Appl. No.: 16/523,112

(22) Filed: Jul. 26, 2019

(51) Int. Cl.
  *G06F 30/398* (2020.01)
  *G06K 9/62* (2022.01)
  *G06N 20/00* (2019.01)

(52) U.S. Cl.
  CPC ......... *G06F 30/398* (2020.01); *G06K 9/6282* (2013.01); *G06N 20/00* (2019.01)

(58) Field of Classification Search
  CPC ..... G06F 30/398; G06K 9/6282; G06N 20/00
  See application file for complete search history.

(56) References Cited

U.S. PATENT DOCUMENTS

| | | | | |
|---|---|---|---|---|
| 6,424,959 B1* | 7/2002 | Bennett, III | .......... | G06F 30/327 706/13 |
| 7,735,036 B2* | 6/2010 | Dennison | ................ | G06F 30/30 716/106 |
| 9,792,397 B1* | 10/2017 | Nagaraja | ............... | G06F 30/327 |
| 10,628,546 B1* | 4/2020 | Colwell | ................ | G06F 30/392 |
| 10,699,043 B2* | 6/2020 | Ho | ........................ | G06N 3/006 |
| 10,699,051 B1* | 6/2020 | Zhang | .................... | G06N 20/00 |
| 2019/0211475 A1* | 7/2019 | Ito | ......................... | G06F 30/327 |

OTHER PUBLICATIONS

"Invited: Align—Open Source Analog Layout Autmation from the Ground Up", by Kishor Kunal, Meghan Madhusudan, Arvin K. Sharma, ACM, Jun. 2-6, 2019.*
"IPRAIL—Intellectual Property Reuse-based Analog IC Layout Automation", Nuttorn Jangkrajarng, Sambuddha Bhattacharya, Roy Hartono, and C.-J. Richard Shi, Mixed-SignalCAD Research Laboratory, https://vannevar.ece.uw.edu/techsite/papers/documents/UWEETR-2003-0004.pdf, Mar. 2003.*

* cited by examiner

*Primary Examiner* — Nha T Nguyen
(74) *Attorney, Agent, or Firm* — Mark H. Whittenberger, Esq.; Holland and Knight LLP

(57) ABSTRACT

The present disclosure relates to a computer-implemented method for electronic design is provided. Embodiments may include receiving, using at least one processor, an electronic design schematic and an electronic design layout and analyzing, via machine learning, at least one schematic feature from a pair of devices associated with the electronic design schematic. Embodiments may further include determining, based, at least in part, upon the analyzing, whether the pair of devices should be grouped together.

20 Claims, 28 Drawing Sheets

200 receiving, using at least one processor, an electronic design schematic and an electronic design layout

202 analyzing, via machine learning, at least one schematic feature from a pair of devices associated with the electronic design schematic

204 determining, based, at least in part, upon the analyzing, whether the pair of devices should be grouped together

15 possible connections between two devices

Example of orientation on schematic

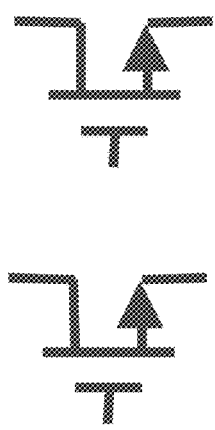
Example of same orientation
FIG. 12A
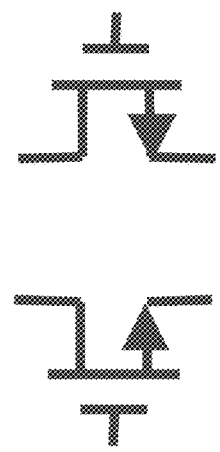
Example of symmetric orientation
FIG. 12B

| Recall/ Precision | Random Forest | Random Forest + Post-Processing |
|---|---|---|
| All Groups 1 | 66% / 78% | 78% / 79% |
| All Groups 1 and 2 | 75% / 85% | 86% / 86% |

FIG. 14

| | |
|---|---|
| Accuracy | 0.9720 |
| Precision | 0.118 |
| Recall | 0.21875 |

Table 1

| | |
|---|---|
| Accuracy | 0.9787 |
| Precision | 0.388 |
| Recall | 0.21875 |

Table 2

Placement Result with Group and Isolated Group Predictor

| Method | CP Recall | CP Precision | PCP Recall | PCP Precision |
|---|---|---|---|---|
| Diff Pair 1&2 | 100% | 100% | 100% | 100% |
| Diff Pair 1 | 100% | 38.2% | 100% | 92.9% |
| Current Mirror 1&2 | 41.3% | 63.3% | 90.7% | 73.9% |
| Current Mirror 1 | 59.5% | 51.0% | 57.1% | 63.2% |

FIG. 28

SYSTEM, METHOD, AND COMPUTER PROGRAM PRODUCT FOR GROUP AND ISOLATION PREDICTION USING MACHINE LEARNING AND APPLICATIONS IN ANALOG PLACEMENT AND SIZING

GOVERNMENT RIGHTS

This invention was made with Government support under Agreement No. HR0011-18-3-0010, awarded by DARPA. The Government has certain rights in the invention.

FIELD OF THE INVENTION

The present disclosure relates to electronic circuit design, and more specifically, to analog and mix-signal design flow, with applications including, but not limited to, placement and sizing.

DISCUSSION OF THE RELATED ART

In existing electronic circuit design systems it may be possible to operate upon analog and mix-signal layouts. It is challenging to automatically place analog devices at the graphical user interface of existing design tools to meet snapping, row style requirements, and/or grouping requirements. If we formulate each possible instance's X and Y as optimization variables, the major design space (e.g., (x1,y1), (x2,y2), (x3,y3) . . . ) are not feasible because of overlapping. As such, the optimization process may not be efficient as most of the optimization variable sets will generate an overlapped placement. It is also very difficult to predict devices that need to be placed in a group in a layout, and whether they need to be isolated. Existing solutions require extensive manual effort.

SUMMARY

In one or more embodiments of the present disclosure, a computer-implemented method for electronic design is provided. The method may include receiving, using at least one processor, an electronic design schematic and an electronic design layout and analyzing, via machine learning, at least one schematic feature from a pair of devices associated with the electronic design schematic. The method may further include determining, based, at least in part, upon the analyzing, whether the pair of devices should be grouped together.

One or more of the following features may be included. In some embodiments, determining may include determining whether the pair of devices should be grouped together as a first group type or a second group type. The method may include grouping the pair of devices together. Analyzing may include analyzing a plurality of pairs of devices and determining whether two or more of the plurality of device pairs should be grouped. The method may also include clustering the two or more of the plurality of device pairs as a clustered group. The at least one schematic feature may be selected from the group consisting of a device type, a device connectivity, a device size, a device schematic position, and a device schematic orientation. Analyzing may include applying a decision tree based classifier to the at least one schematic feature. Determining may include determining whether the pair should be included as an isolated group. Determining may be based upon, at least in part, whether the pair is associated with a known structure.

In one or more embodiments of the present disclosure, a system for electronic design is provided. The system may include a computing device having at least one processor configured to perform one or more operations. Operations may include receiving, using at least one processor, an electronic design schematic and an electronic design layout and analyzing, via machine learning, at least one schematic feature from a pair of devices associated with the electronic design schematic. Operations may further include determining, based, at least in part, upon the analyzing, whether the pair of devices should be grouped together.

One or more of the following features may be included. In some embodiments, determining may include determining whether the pair of devices should be grouped together as a first group type or a second group type. Operations may include grouping the pair of devices together. Analyzing may include analyzing a plurality of pairs of devices and determining whether two or more of the plurality of device pairs should be grouped. Operations may also include clustering the two or more of the plurality of device pairs as a clustered group. The at least one schematic feature may be selected from the group consisting of a device type, a device connectivity, a device size, a device schematic position, and a device schematic orientation. Analyzing may include applying a decision tree based classifier to the at least one schematic feature. Determining may include determining whether the pair should be included as an isolated group. Determining may be based upon, at least in part, whether the pair is associated with a known structure.

In yet another embodiment of the present disclosure a non-transitory computer readable medium having stored thereon instructions that when executed by a processor result in one or more operations is included. Operations may include receiving, using at least one processor, an electronic design schematic and an electronic design layout and analyzing, via machine learning, at least one schematic feature from a pair of devices associated with the electronic design schematic. Operations may further include determining, based, at least in part, upon the analyzing, whether the pair of devices should be grouped together.

One or more of the following features may be included. In some embodiments, determining may include determining whether the pair of devices should be grouped together as a first group type or a second group type. Operations may include grouping the pair of devices together. Analyzing may include analyzing a plurality of pairs of devices and determining whether two or more of the plurality of device pairs should be grouped. Operations may also include clustering the two or more of the plurality of device pairs as a clustered group. The at least one schematic feature may be selected from the group consisting of a device type, a device connectivity, a device size, a device schematic position, and a device schematic orientation. Analyzing may include applying a decision tree based classifier to the at least one schematic feature. Determining may include determining whether the pair should be included as an isolated group. Determining may be based upon, at least in part, whether the pair is associated with a known structure.

In yet another embodiment of the present disclosure a computing system including one or more processors and one or more memories configured to perform operations is included. The one or more processors may be configured to receive an electronic design schematic and an electronic design layout and to analyze at least one schematic feature from a pair of devices associated with the electronic design schematic. The one or more processors may be configured to determine, based, at least in part, upon the analyzing, whether the pair of devices should be grouped together. Determining may include determining whether the pair of devices should be grouped together as a first group type or a second group type.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 2 is a flowchart depicting operations consistent with the circuit grouping process in accordance with an embodiment of the present disclosure;

FIG. 12A-12B are diagrams depicting same vs. symmetric orientation consistent with the circuit grouping process in accordance with an embodiment of the present disclosure;

FIG. 14 is a diagram depicting example results consistent with the circuit grouping process in accordance with an embodiment of the present disclosure;

FIG. 28 is a diagram depicting aspects of a probabilistic circuit prospector process in accordance with an embodiment of the present disclosure.

DETAILED DESCRIPTION

Figure 1:
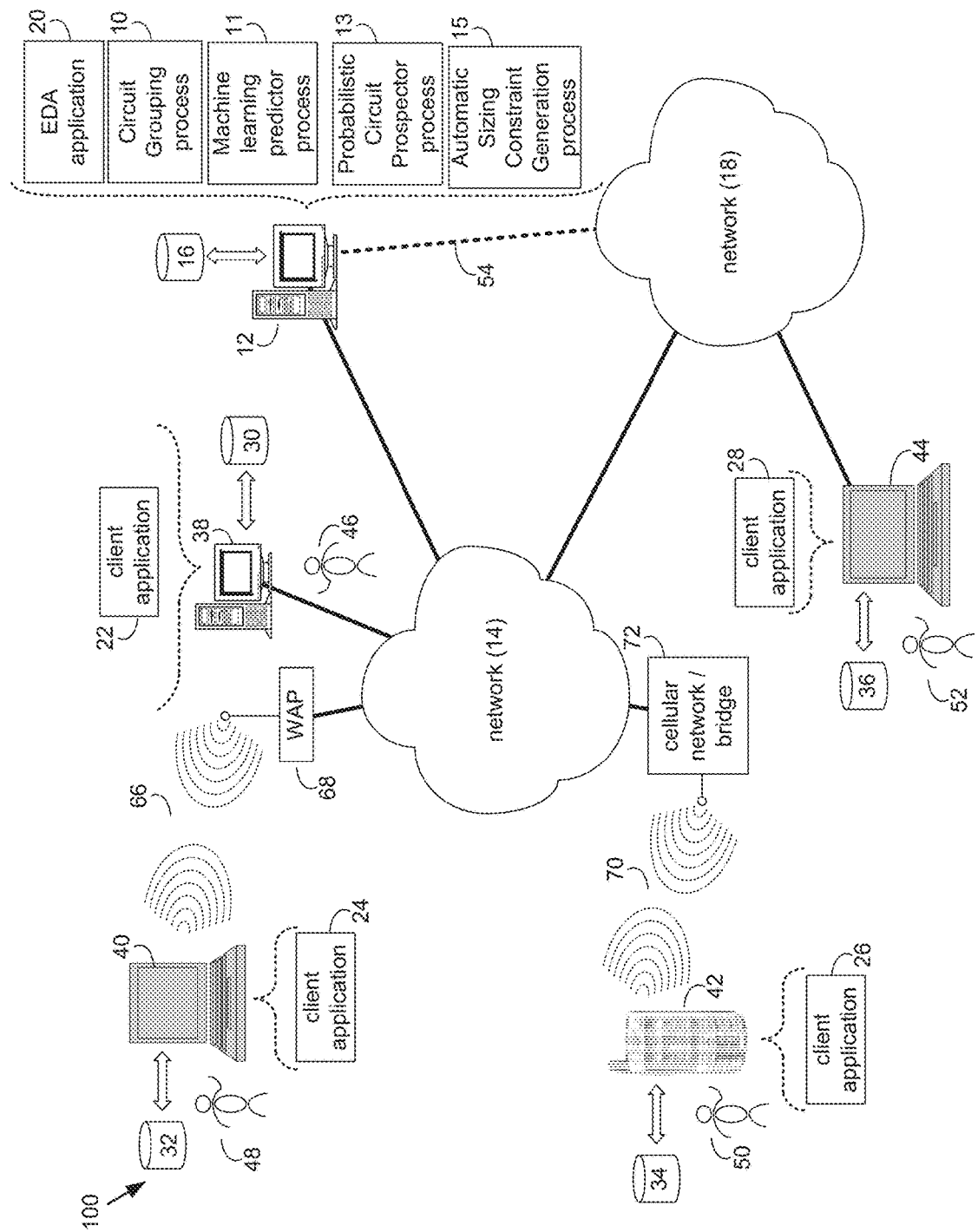
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosures. Some hardware description languages may include, but are not limited to, Verilog, VHDL, and Verilog-AMS. Various other hardware description languages may also be used as well.

Referring to FIG. 1, there is shown circuit grouping process 10, machine learning prediction process 11, probabilistic circuit prospector process 13, and an automatic sizing constraint generation process 15 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the processes 10, 11, 13, and 15 may reside on and be executed, in whole or in part, by a client electronic device, such as a personal computer, notebook computer, personal digital assistant, or the like.

The instruction sets and subroutines of the processes 10, 11, 13, and 15, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive;

a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Processes 10, 11, 13, and 15 may be a stand alone application, or may be an applet/application/script that may interact with and/or be executed within EDA application 20. In addition/as an alternative to being a server-side process, the circuit grouping process may be a client-side process (not shown) that may reside on a client electronic device (described below) and may interact with an EDA client application (e.g., one or more of EDA client applications 22, 24, 26, 28). Further, the circuit grouping process may be a hybrid server-side/client-side process that may interact with EDA application 20 and an EDA client application (e.g., one or more of client applications 22, 24, 26, 28). As such, the processes may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize the processes 10, 11, 13, and 15.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54. Some or all of the operations discussed herein with regard to processes 10, 11, 13, and 15 may be performed, in whole or in part, in the cloud as a cloud-based process including, for example, networks 14, 18 and any others.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Embodiments included herein are directed towards a circuit grouping process 10 configured to use machine learning models for layout group and isolation prediction, a machine learning predictor process 11 configured to perform placement of analog devices using machine learning, a probabilistic circuit prospector process 13 configured to perform analog structure prediction, and an automatic sizing constraint circuit generation process 15 that may be configured to perform sizing constraint setup using one or more machine learning predictors. Each of these is discussed in further detail hereinbelow.

Referring now to FIG. 2, an example flowchart depicting operations consistent with an embodiment of circuit grouping process 10 is provided. The process may include receiving (202), using at least one processor, an electronic design schematic and an electronic design layout and analyzing (204), via machine learning, at least one schematic feature from a pair of devices associated with the electronic design schematic. Embodiments may further include determining (206), based, at least in part, upon the analyzing, whether the pair of devices should be grouped together. Numerous other operations are also within the scope of the present disclosure.

Figure 3:
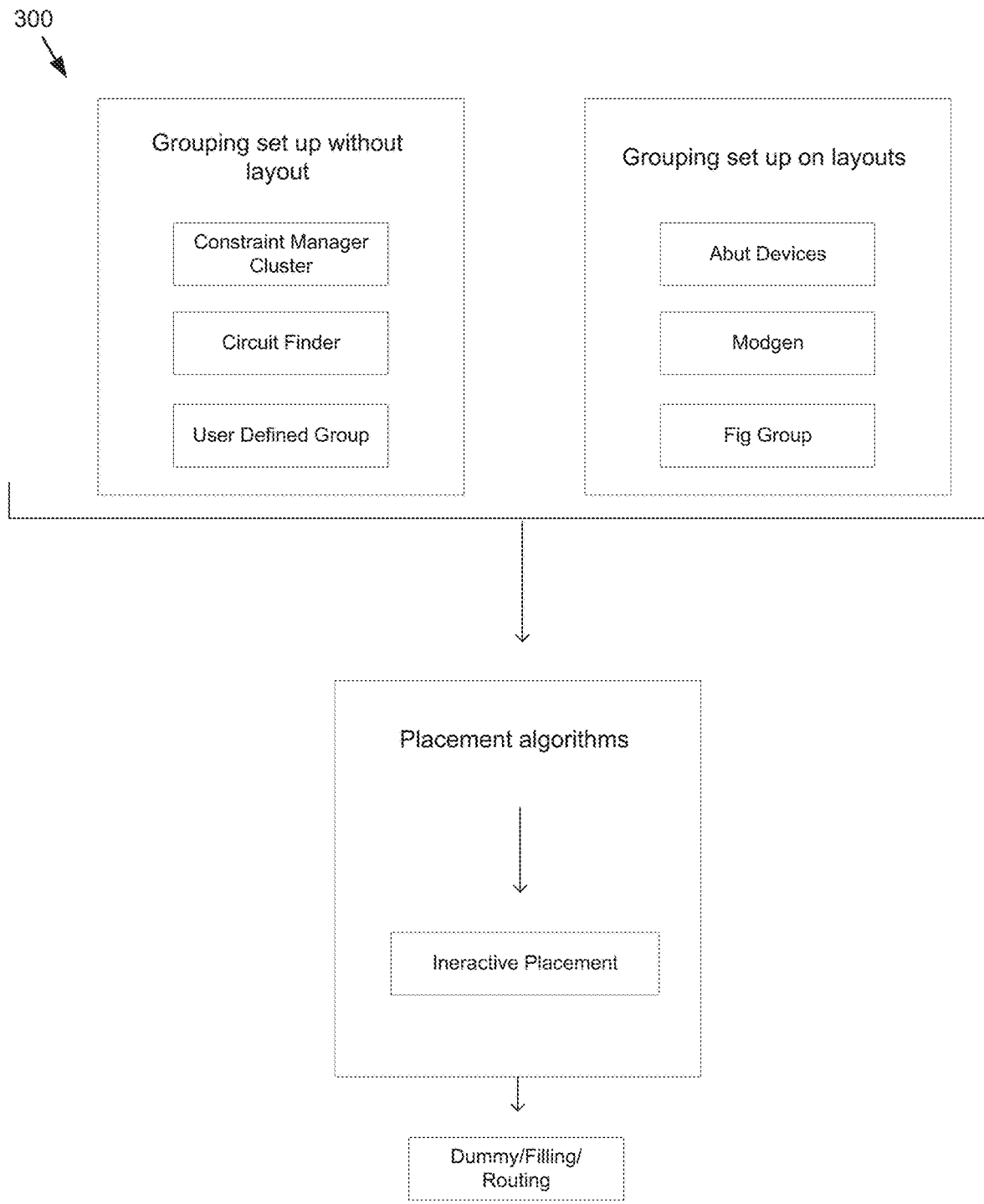
FIG. 3 is a flowchart depicting operations consistent with the circuit grouping process in accordance with an embodiment of the present disclosure.

Referring now to FIG. 3, a flowchart 300 depicting example operations associated with analog device placement is provided. In some embodiments, structured devices may need to be grouped together in an analog and mix-signal layout. The device grouping requirements may be imported from any suitable electronic design application. Some of these may include, but are not limited to, constraint manager, module generation, circuit finder or machine learning models, etc. Users may be able to visualize and modify device grouping requirements. The group setup may be stored in a database (e.g. a layout view database, etc.) and may be shared with different algorithms. Users may execute automatic placement algorithms with assisted placement help to finish a particular placement job.

Figure 4:
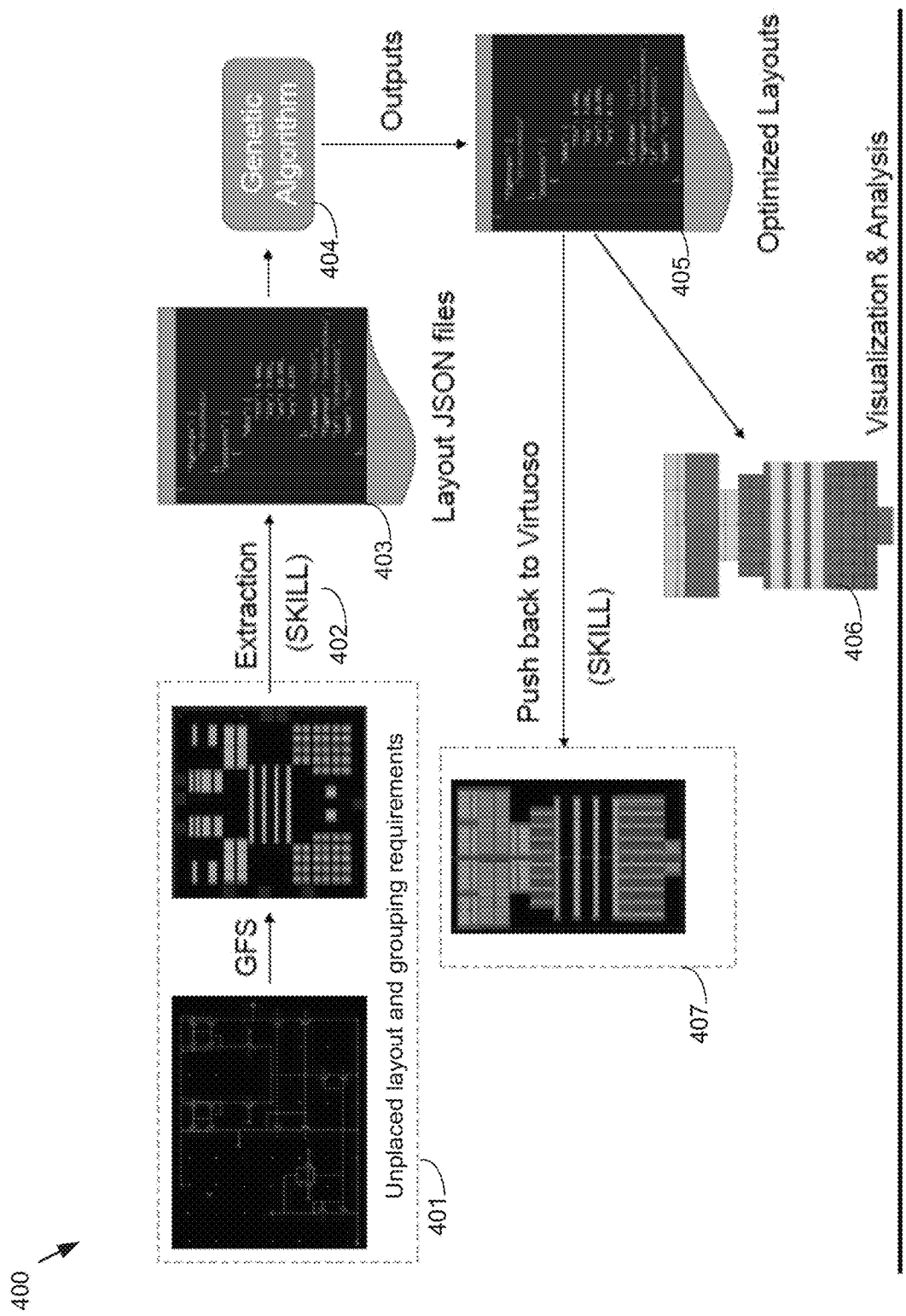
FIG. 4 is a flowchart depicting operations consistent with the circuit grouping process in accordance with an embodiment of the present disclosure.

Referring now to FIG. 4, an example flowchart 400 showing operations consistent with some embodiments of the present disclosure is provided. A graphical user interface 401 may be provided, which may include an unplaced layout and one or more grouping requirements. During the extraction phase 402 the instances that need to be placed, the placeable area, as well as important characteristics of the instances and a proper formatting process for a genetic algorithm may all be determined. A genetic algorithm ("GA") generally refers to a bio-inspired or evolutionary algorithm that may be used for optimization and search problems. A GA may simulate the process of natural selection and evolution. The goal is to find the best "fit" individuals or those with the best genes. The information extracted may be represented as an intermediate representation 403 using any suitable format such as the layout JSON file example shown in FIG. 4. The genetic algorithm 404 may be applied and one or more optimized layouts 1105 may be generated as an output. Embodiments included herein may provide visualization and analysis 406 using a graphical user interface and also generate a final layout 407 after positions and orientations are determined. It should be noted that none of the processes described herein require the use of a genetic algorithm. The placement tool and/or circuit optimizer included herein may be written using a genetic algorithm, however, this is provided merely by way of example and is not intended to limit the scope of the present disclosure.

Referring now to FIGS. 5-16, embodiments of circuit grouping process 10 are provided. Embodiments of circuit grouping process 10 may be configured to perform pairwise classification with schematic features and perform clustering to form groups. Embodiments may subsequently post-process the group results to further decide if they should be isolated. Accordingly, embodiments of circuit grouping process 10 may be configured to predict devices that need to be placed in a group in a layout, and whether they need to be isolated. Circuit grouping process 10 may be configured to learn how grouping is performed using established, viable, hand-crafted designs and to then apply it to new designs. These designs may be received and/or based upon the customer's own inputs in certain situations. This approach may be used to greatly reduce manual input, which is important to analog placement automation.

Figure 5:
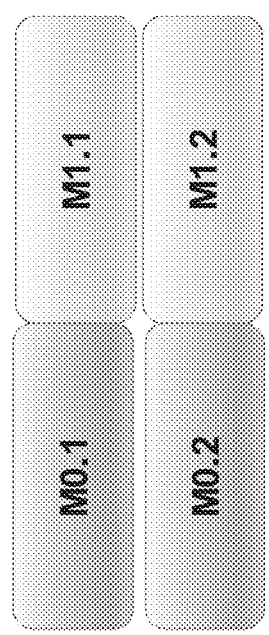
FIG. 5 is a diagram depicting examples of grouping consistent with the circuit grouping process in accordance with an embodiment of the present disclosure.
Figure 5:
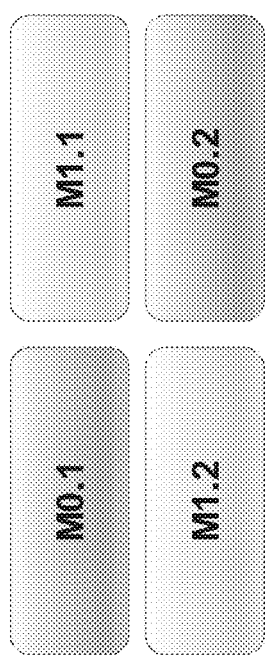
Figure 6:
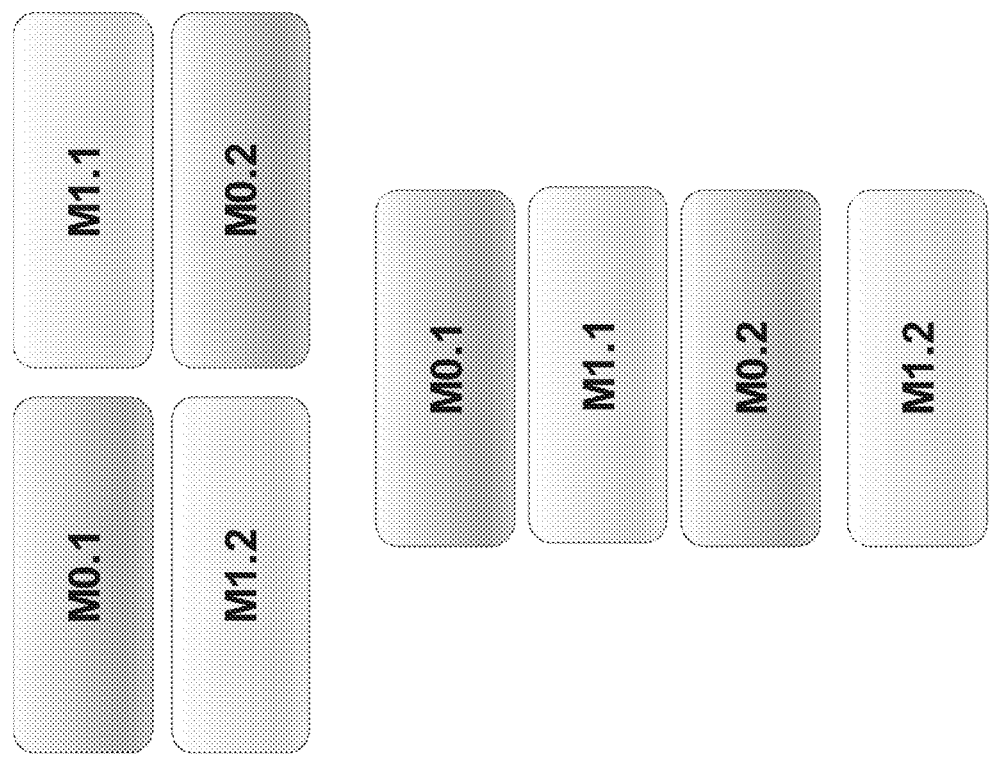
FIG. 6 is a diagram depicting examples of grouping consistent with the circuit grouping process in accordance with an embodiment of the present disclosure.

Referring to FIG. 5, a diagram 500 of circuit grouping process 10 depicting group type labeling is provided. In order to predict grouping, embodiments included herein may create one or more labels based upon one or more of an electronic design schematic and an electronic design layout. In this particular example, two different labels, group type 1 and group type 2 are provided. In operations, devices may need to be placed together if they are either type 1 or type 2. The group needs to be interdigitated if it is type 1. In this particular example, there may be two transistors, namely M1 and M2 and FIG. 5 depicts multiple instances of the same schematic devices (e.g., M0.1 and M0.2, etc.). FIG. 6 depicts a diagram 600 showing that group 1 may be the stronger version of grouping, which may require two or more devices forming an interdigitating pattern. This pattern may minimize any mismatch between devices, at the cost of possibly larger area.

Figure 7:
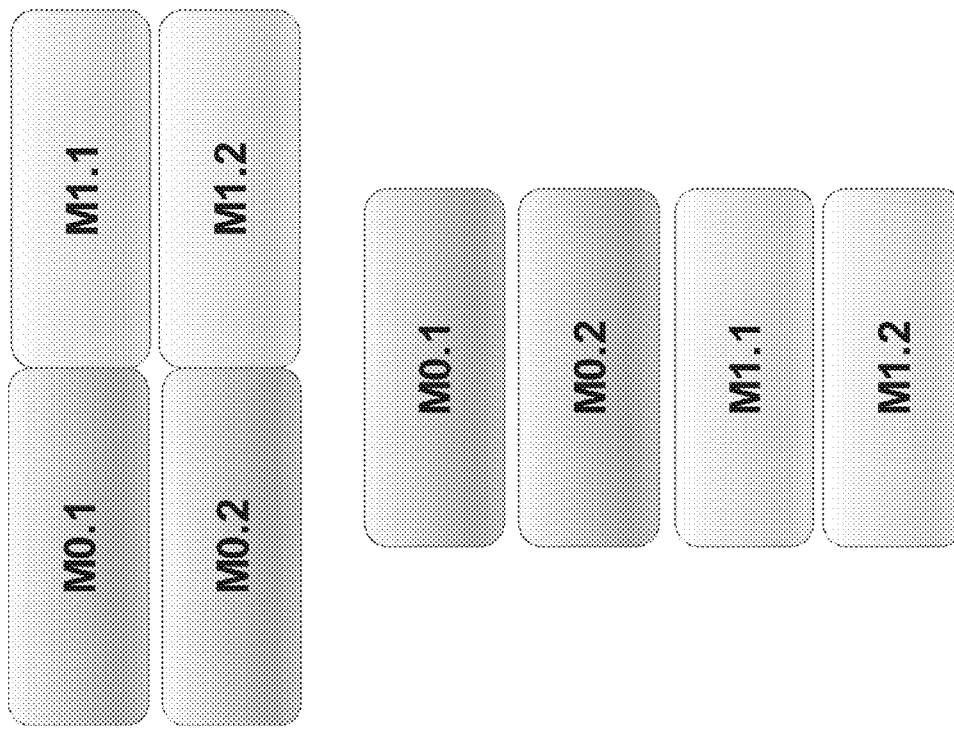
FIG. 7 is a diagram depicting examples of grouping consistent with the circuit grouping process in accordance with an embodiment of the present disclosure.

Referring to FIG. 7, a diagram 700 of circuit grouping process 10 depicting an example of group type 2. In some embodiments, group type 2 may include devices that may be placed closely together. To exclude devices that happen to be close for no particular reason, embodiments may add one or more constraints in order for devices to be considered as group type 2. Accordingly, devices need to have a non-power connection and devices must be abutted if they can, or placed with minimum spacing if they cannot be abutted. Embodiments of circuit grouping process 10 may be configured to predict one group type or both group types.

Figure 8:
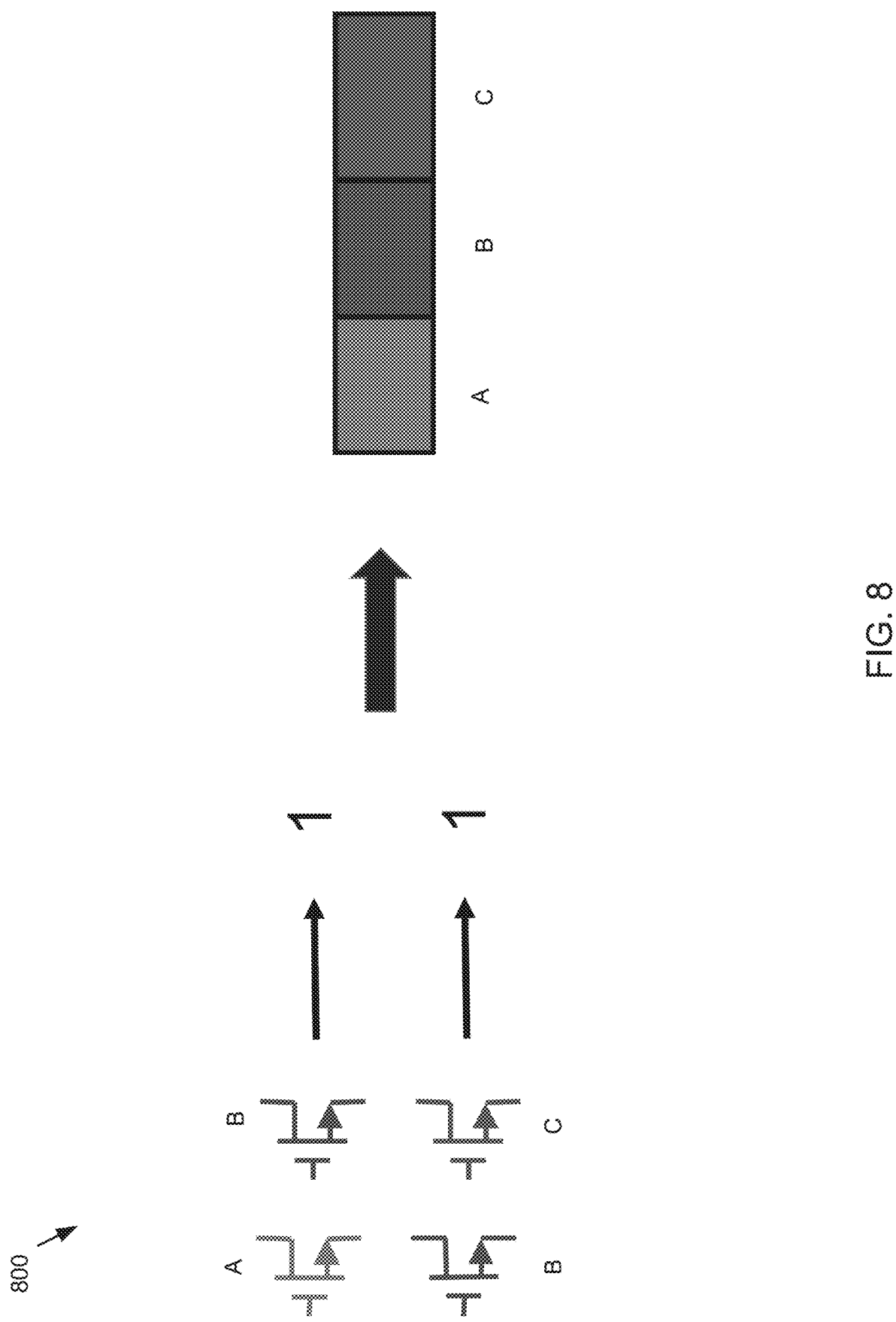
FIG. 8 is a diagram depicting examples of grouping consistent with the circuit grouping process in accordance with an embodiment of the present disclosure.

Referring now to FIG. 8, a diagram 800 showing an example of pairwise classification and clustering consistent with embodiments of circuit grouping process 10 is provided. Embodiments of circuit grouping process 10 may be configured to solve the following classification problem: Given the schematic features from of a pair of devices, predict whether the two devices are in a group or not. In some embodiments, pairs that are classified as being in the same group may be clustered to form larger groups containing more than two devices.

Figure 9:
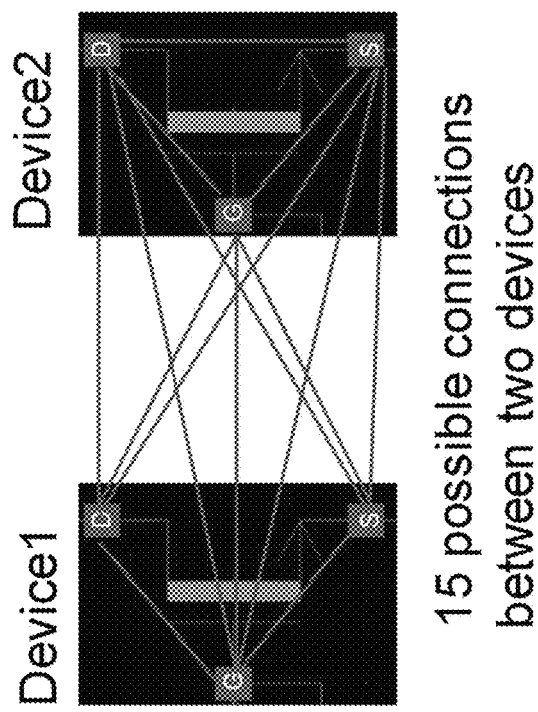
FIG. 9 is a diagram depicting examples of grouping consistent with the circuit grouping process in accordance with an embodiment of the present disclosure.
Figure 9:
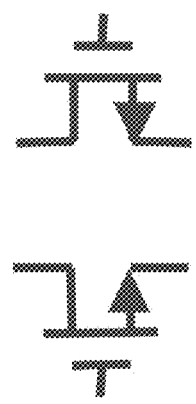

Referring now to FIG. 9, a diagram 900 showing two devices and the number of possible connections that are possible therebetween is provided. In this particular example, there are 15 possible connections between device 1 and device 2. Whether each of the 15 possible connections exist is formulated as a 15-bit vector as the feature for the machine learning algorithm. In some embodiments, a number of additional features may be used for classification (e.g. for each pair, etc.). For example, a number of features may be formed based upon, at least in part, one or more schematic properties. Some of these properties may include, but are not limited to, device type (e.g., N or P, cell name), how two devices are connected, the size of the devices (e.g., length, number of fins, number of fingers, m factor, number of stacks, iterated instances), the schematic position of the devices, the schematic orientation of the devices, etc. Embodiments of circuit grouping process 10 may be configured to utilize one or more machine learning algorithms, which may be configured to learn how to predict the appropriate group label from these features.

Figure 10:
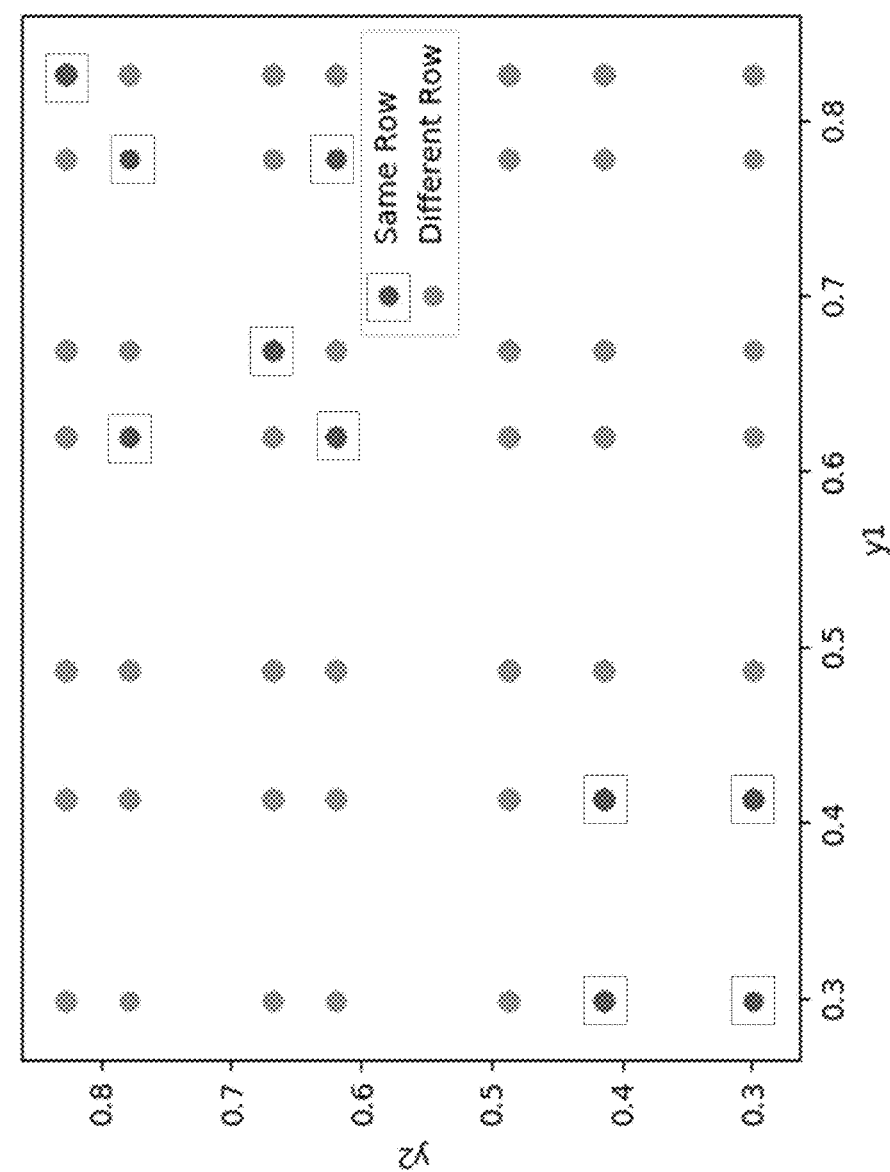
FIG. 10 is a plot of y1 vs. y2 consistent with the circuit grouping process in accordance with an embodiment of the present disclosure.

Referring now to FIG. 10, a diagram 1000 showing the relationship between the schematic position of devices on feature transformation. Diagram 1000 includes a plot of y positions of two devices. Some features, like connectivity, may be directly used by a machine learning algorithm. However, some require nonlinear transformation to be more accurate. The schematic position of devices often correlates with the position in layout. For example, directly using the schematic positions (x1, y1), for device 1, and (x2, y2), for device 2, as features may not work with a simple classifier because there is no linear dependency. In some embodiments, feature transformation may be performed as a pre-processing operation.

Figure 11:
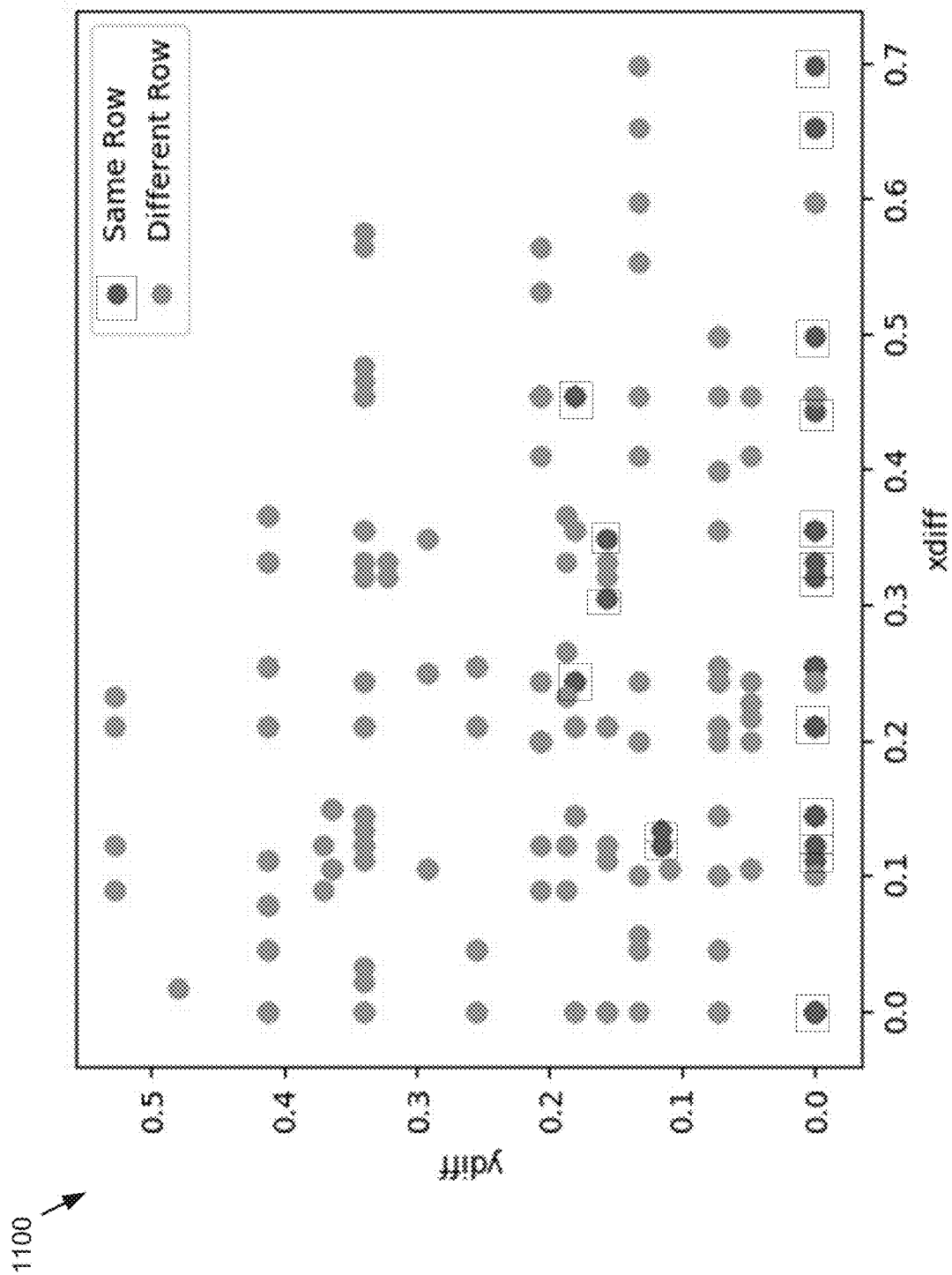
FIG. 11 is a plot of xdiff vs. ydiff consistent with the circuit grouping process in accordance with an embodiment of the present disclosure.

Referring now to FIG. 11, a diagram 1100 showing the relationship between the schematic position of devices on feature transformation. Diagram 1100 includes a plot of xdiff vs. ydiff for two devices. In this particular example, a transformed feature may include an xdiff=abs(x1−x2) and a ydiff=abs(y1−y2). Here, the smaller the difference between devices results in higher accuracy. The features may be 0 when two devices are in the same column and/or row, and the value may increase with the x/y distance. The ydiff value is a very strong feature for indicating a same row relationship. Similarly, symmetry features may be used as a measurement of how much two devices look like they are in a symmetric position in a schematic.

Referring again to FIG. 9, embodiments of circuit grouping process 10 may analyze device size features. This may operate similar to position features, as two devices having a similar size may have a good correlation with being in the same row. The device size features need to be transformed in a similar way, for example:

$$finger\_diff=abs(log(finger1)-log(finger2))$$

$$fin\_diff=abs(log(fin1)-log(fin2))$$

$$l\_diff=abs(log(l1)-log(l2))$$

In some embodiments, the log may be used as it may be more natural to consider size of device 1 is k times larger than device 2, instead of k nm larger.

In some embodiments, numerous other features may be used as part of the feature transformation. Some of these may include, but are not limited to, orientation difference, device type difference, etc.

Referring now to FIG. 12, an embodiment showing an example orientation difference is provided. In some embodiments, various features may be added for an orientation difference. For example, whether an orientation is the same (e.g., 1 if the same, 0 if not) and/or whether orientation is not the same but symmetric (e.g. 1 if the same, 0 if not). FIG. 12A shows an example of a same orientation and FIG. 12B shows an example of a symmetric orientation.

In some embodiments, various features may be added for a device type difference. These may include both primary type and secondary type differences. For a primary type, both may be NMOS, PMOS, etc. For a secondary type, this may include the same as the primary type but different in exact device type (e.g., standard vth vs. low vth, etc.).

Figure 13:
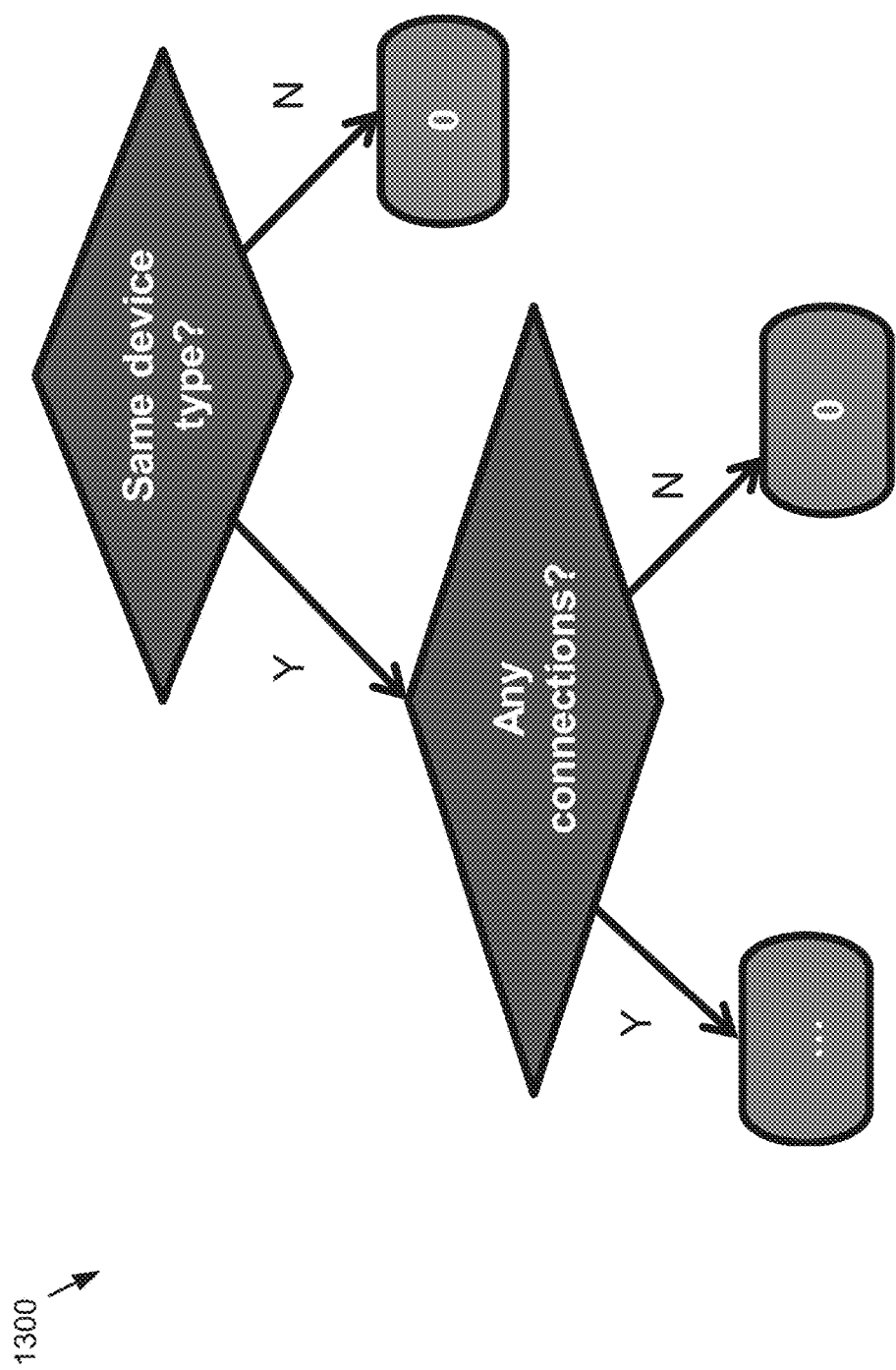
FIG. 13 is a diagram depicting an example decision tree based classifier consistent with the circuit grouping process in accordance with an embodiment of the present disclosure.

Referring now to FIG. 13, an embodiment showing an example decision tree based classifier is provided. It should be noted that any suitable classifier may be used without departing from the scope of the present disclosure. The learned decision tree is a number of nested if-else statements based on the features, similar to how designers would typically solve the problem by hard-coding. In some embodiments, which features are used, how they are used and the order may be automatically learned by the algorithm. Accuracy may be improved by using a decision tree ensemble. Additionally and/or alternatively, a Random Forest algorithm may be employed, however, other decision tree ensembles may also be used (e.g. gradient boosting).

Referring now to FIG. 14, a diagram depicting example results using circuit grouping process 10 is provided. Embodiments of the present disclosure may provide better accuracy by post processing the results to break overly large groups formed by clustering. Accordingly, circuit grouping process 10 may be configured to apply one or more machine learning classifiers to detect the groups. In groups detected by the machine learning classifier, embodiments included herein may be configured to apply a structure detector such as circuit prospector, or probabilistic circuit prospector to detect structures. If the group contains multiple structures, some embodiments may be configured to apply a third predictor to determine whether any structures cannot coexist in a group, and then separate the group in such a situation.

Figure 15:
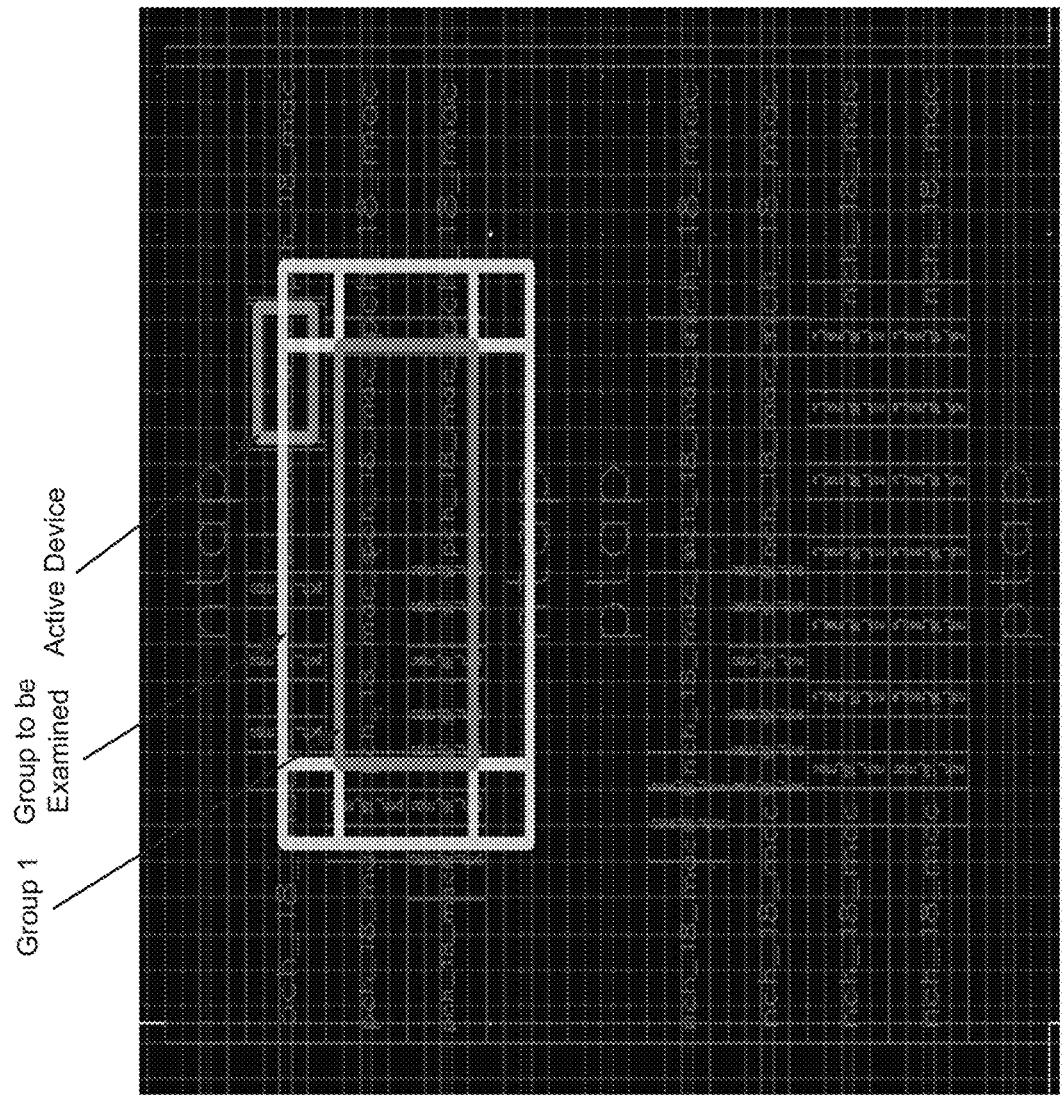
FIG. 15 is a diagram depicting examples of isolated group prediction consistent with the circuit grouping process in accordance with an embodiment of the present disclosure.

Referring now to FIG. 15, an embodiment showing isolated group prediction consistent with embodiments of circuit grouping process 10 is provided. A group is considered isolated if there are no active devices around it. In some embodiments, adding dummy devices to the layout aids in achieving a more uniform metal density across the die and wafer as well as better matching between devices by abating the etch effects during fabrication. Accordingly, in some embodiments, circuit grouping process 10 may be configured to surround certain devices with dummies. In addition to forming the group, embodiments included herein may also be configured to detect whether the group should be isolated from the other devices, e.g., surrounded with dummies. In FIG. 15, there is shown a box around Group 1, a separate box around the group that will be examined, and a third box around an active device (e.g., Device_1). Group_1 is not sensitive because there is an active device, Device_1, in its vicinity. Group_1 would have been sensitive if there were no active devices and/or other groups in the area being scanned.

In some embodiments, circuit grouping process 10 may predict an isolated group using a variety of different approaches. For example, the system may predict an isolated group label using a machine learning classifier similar to group label prediction. The features may be similar and the isolated group label may be a subset of the group label. After predicting the groups, circuit grouping process 10 may only try to predict the isolated group if the group forms a known structure (e.g., diff pair, cross coupled diff pair, current mirror, cascode current mirror, cascode series current mirror, etc.). If the group is a known structure and the structure is isolated >50% in training data, then predict true, otherwise predict false.

Figure 16:
FIG. 16 is a diagram depicting example results consistent with the circuit grouping process in accordance with an embodiment of the present disclosure.

Referring now to FIG. 16, an example showing isolated group predictor results is provided. In this particular example, Table 1 reports the performance metrics of the isolated group predictor on sixteen customer designs. Two out of the sixteen test designs follow a custom digital style of layout which is significantly different from the rest of the designs. Table 2 reports the performance metrics when the two designs are excluded. As shown in the tables, the precision drastically increased. Despite not having a high recall/precision score, more often than not having an isolated group predictor helps producing a layout that is closer to a hand-crafted design style.

Referring now to FIGS. 17-23, embodiments of machine learning predictor process 11 showing the integration of machine learning predictors in the automatic placement of analog devices are provided. In existing systems it is difficult for a placement tool (e.g., a genetic placement tool such as those available from the Assignee of the present disclosure) to capture user intent and generate a satisfying solution. These existing systems utilize a placement tool with a hand-tuned cost function and require excessive user input on constraints. Embodiments included herein may be configured to train machine learning predictors on users' own layouts to capture user intent. The system may then integrate them into a placement tool or other applications.

It should be noted that one of the predictors that can be integrated is similar to those described above with regard to circuit grouping process 10. However, these are not intended to be the only predictor in analog placement, as numerous other predictors may be integrated as well, including, but not limited to those available from the Assignee of the present disclosure. While machine learning predictor process 11 may be an application of circuit grouping process 10 it is provided merely by way of example as numerous other applications are also within the scope of the present disclosure. The same predictor may be used for other non-placement purposes, such as sizing/routing.

As discussed above, the genetic algorithms used in accordance with machine learning predictor process 11 may utilize a cost function (also referred to herein as a fitness function) formulation. Some cost types may include, but are not limited to, area, wirelength, likeness to circuit schematic, likeness to reference layout, etc. As such, the selection operates on the cost value of each chromosome. For example:

Total cost=$W1$*Area_cost+$W2$*Wirelength_cost

Area_cost=area/min_area

Wirelength_cost=wirelength/min_wirelength

In this particular example, the default setting may be $W1=W2=1$ and users may have control of weights W1 and W2. The area may refer to the area of a box and the wire length may refer to the half perimeter sum of all nets.

In some embodiments, machine learning predictor process 11 may analyze one or more quality metrics such as area and wire-length, which may be used to determine the quality of placement results. Machine learning predictor process 11 may produce one placement with minimum area and one placement with minimum wire length. Users may be provided with one or more user-selectable options to adjust the weight of area and/or wire-length for the optimization trade-off.

In some embodiments, machine learning predictor process 11 may be configured to integrate one or more machine learning predictors in placement tool. The integration may be performed in a number of ways, for example, as a hard constraint, as a cost function term, etc. Accordingly, the teachings of the present disclosure may be used to greatly improve placement quality, which is of paramount importance to analog placement automation.

In some systems, a placement tool may be configured to place all devices by solving an optimization problem that minimizes a cost function, which traditionally contains the area and wirelength of the circuit. The optimization problem may look like:

$$\min_x \{f(x)=w1*area+w2*wireLength\}$$

where x is a vector that encodes the placement of all devices

In reality, the users' placement intent may be far more involved than simple terms such as area and wire length, so that the optimal solution from this type of optimization may be far from optimal in the actual users' mind. Generating a satisfying solution may require that users provide a large number of constraints to the placement tool to capture their intent, however, this is time consuming and difficult to use.

Accordingly, embodiments of machine learning predictor process 11 may be configured to receive some of the users' own layouts and then utilize a number of machine learning predictors, which may be trained to capture the users' design intent. In general, these machine learning predictors may take the following form:

$g(x)=p$ where x is the placement (in reality only part of x may be used)

where g(x) is a learned function to map the placement to a decision where p can be a label (e.g., 0 or 1), or it can be a probability for a certain label In some embodiments, some machine learning predictors may include, but are not limited to, same row (e.g., given two devices, predict whether they should be placed in same row), left/right (e.g., given two devices, predict which one is placed to the left), above/below (e.g., given two devices, predict which one is placed above), group (e.g., given several devices, predict whether they should be placed together in a rectangle), etc.

In some embodiments, machine learning predictors may be used as a hard constraint. For example, certain predictors may be integrated as hard constraints, which involves modifying the placement tool internal mechanics to only consider solutions that satisfy the machine learning predictors. Hard constraints may be used for group predictor integration in genetic placement tool. For example, if schematic devices (D1, D2, ..., Dk) with (m1, m2, ..., mk) layout instances form a group, they may be treated by the placement tool as if they come from one device with (m1+m2+ ... +mk) instances. The isolated group predictor may be integrated similarly by treating the group as if it has extra rows and columns.

Figure 17:
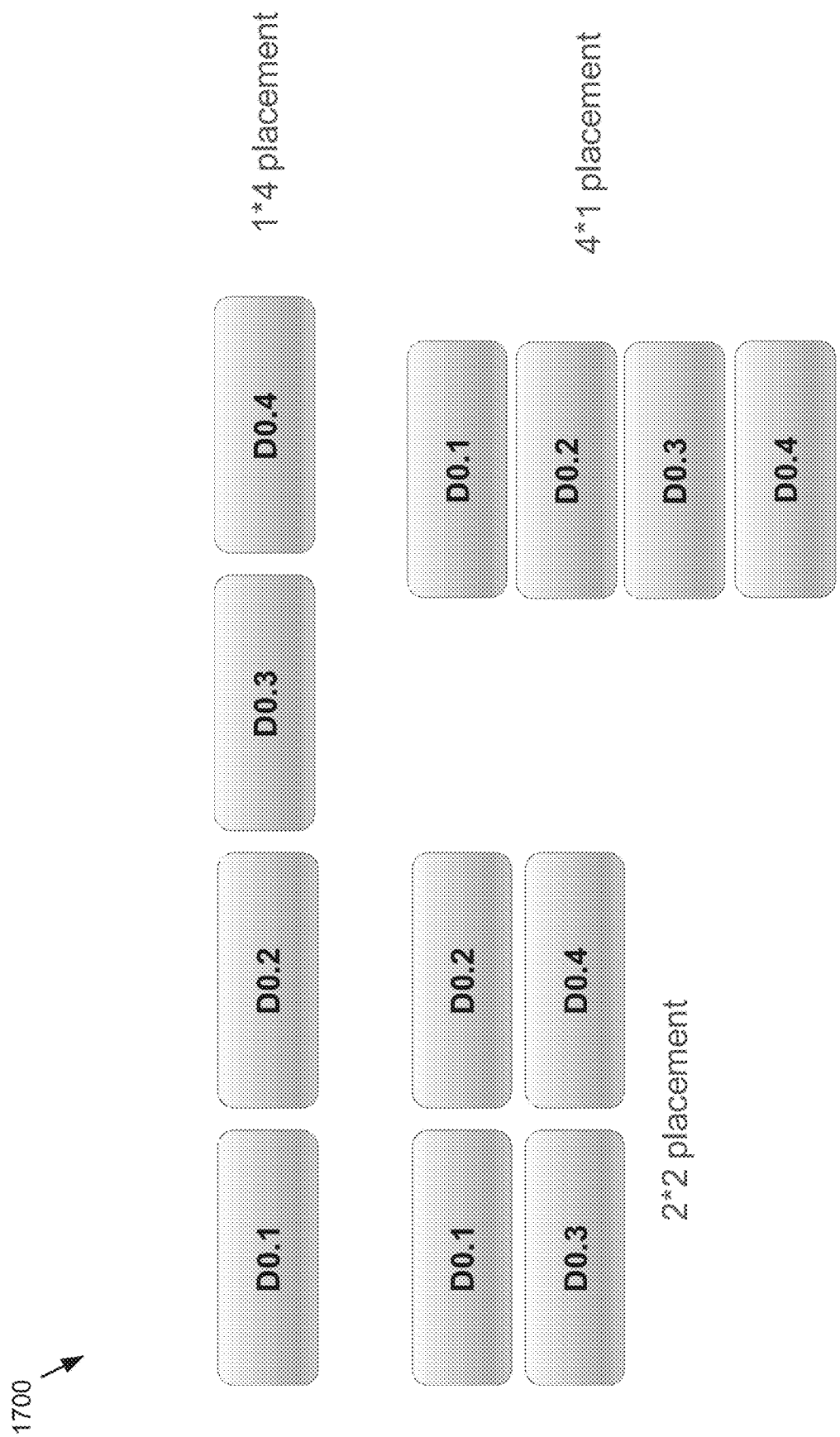
FIG. 17 is a diagram depicting aspects of a machine learning prediction process in accordance with an embodiment of the present disclosure.

Referring now to FIG. 17, an embodiment showing a group prediction integration example without grouping is provided. In this particular example, suppose there are two devices, D0 and D1, each with an m factor of four (corresponding to four layout instances). Without grouping, machine learning predictor process 11 may search for the lowest cost with one of the following four settings for D0, and also independently for D1 as shown in the Figure.

Figure 18:
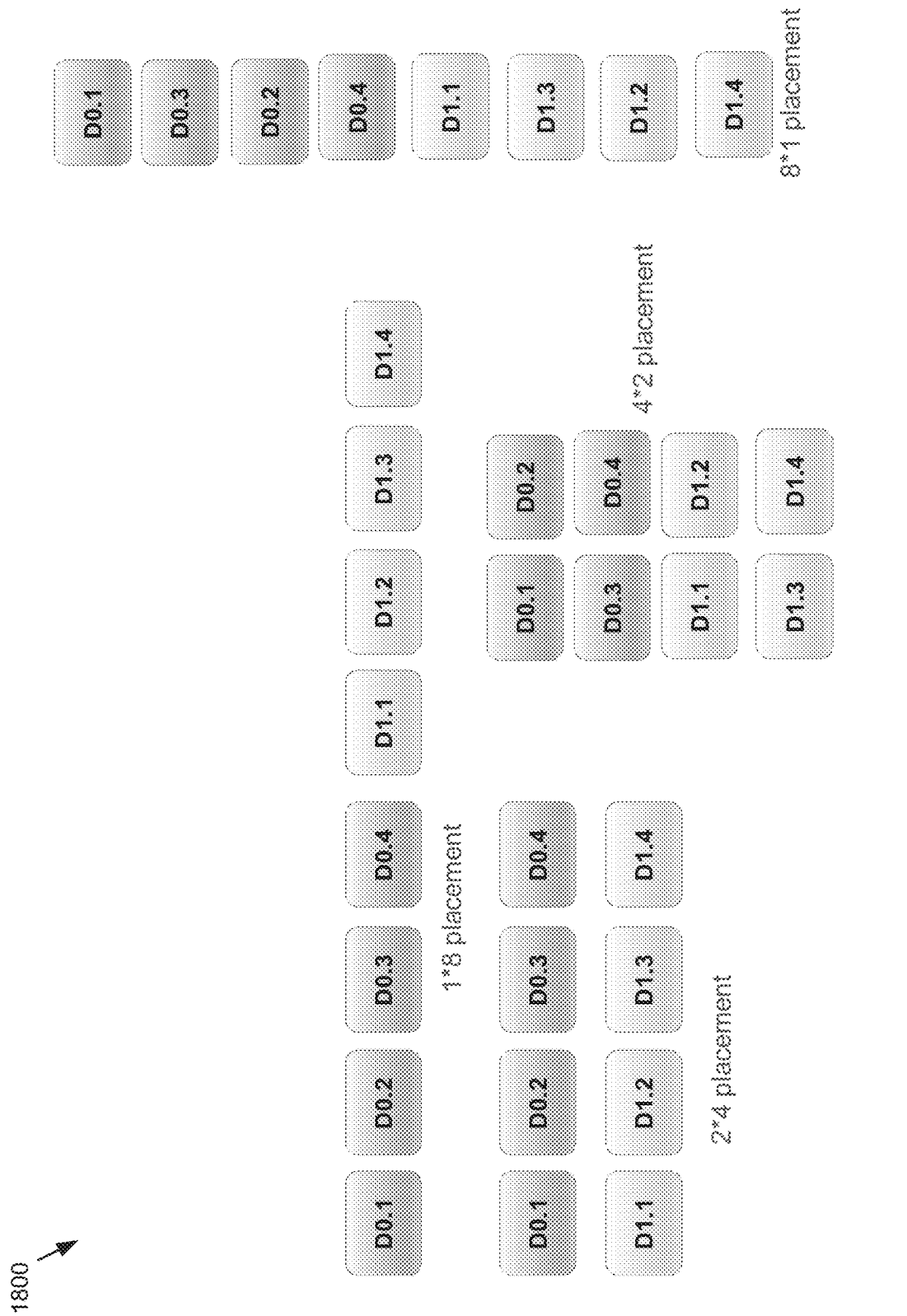
FIG. 18 is a diagram depicting aspects of a machine learning prediction process in accordance with an embodiment of the present disclosure.

Referring now to FIG. 18, an embodiment showing a group prediction integration example with grouping is provided. With grouping, machine learning predictor process 11 may now search for an optimal combined placement of eight instances. Placement within the group may also be subject to cost function or other predictors. This particular example shows four possible aspect ratios.

In some embodiments, the machine learning predictor may be used as a cost function term. Accordingly, the placement tool may be allowed to generate solutions that don't satisfy machine learning prediction, and such solutions may be penalized in the cost function.

The cost function may look like:

$$\min_x f(x) =$$

$$w_1 * \text{area} + w_2 * wireLength + w_3 * predictor1 + w_4 * predictor2 + \ldots$$

For example, if using a same row predictor integration in a placement tool, each same row prediction that is not satisfied may be assessed a penalty that is proportional to the prediction probability. The same row predictor may generate a set of N pairs that it predicts to be in the same row:

$$(D_{11},D_{12}),(D_{21},D_{22}),\ldots,(D_{N1},D_{N2})$$

In some embodiments, each pair may be associated with a probability, which may be the confidence of the predictor in making this decision:

$$p_1,p_2,\ldots,p_N$$

In some embodiments, when the placement tool generates a solution, each of the N pairs may be checked to see if the prediction is satisfied, the related cost is:

$$c_i = \begin{cases} 0 & \text{if prediction is satisfied} \\ p_i & \text{if prediction is not satisfied} \end{cases}$$

In some embodiments, the following term may be added to the cost function, where $c_i$ is the machine learning confidence in its prediction:

$$\min_x f(x) = w_1 * area + w_2 * wireLength + w_3 * \sum_{i=1}^{N} c_i$$

In some embodiments, the third term is the cost of not satisfying the same row predictor. If all same row predictions are satisfied, the term is zero. Other predictors like left/right, above/below, etc. may be added as additional terms. The weight (w1, w2, w3, . . . ) may be empirically determined or learned by other machine learning predictors.

In some embodiments, more than one integration method may be used. For example, for grouping, it may also be possible to generate the solution first, and check whether predicted grouping is satisfied. When both methods are available, the hard constraint method may be computationally more efficient as the solution space is smaller, however, the cost function method may be more flexible since it may be possible to enable a balance between a given predictor and other goals like area, wire length, and other machine learning predictors.

Figure 19:
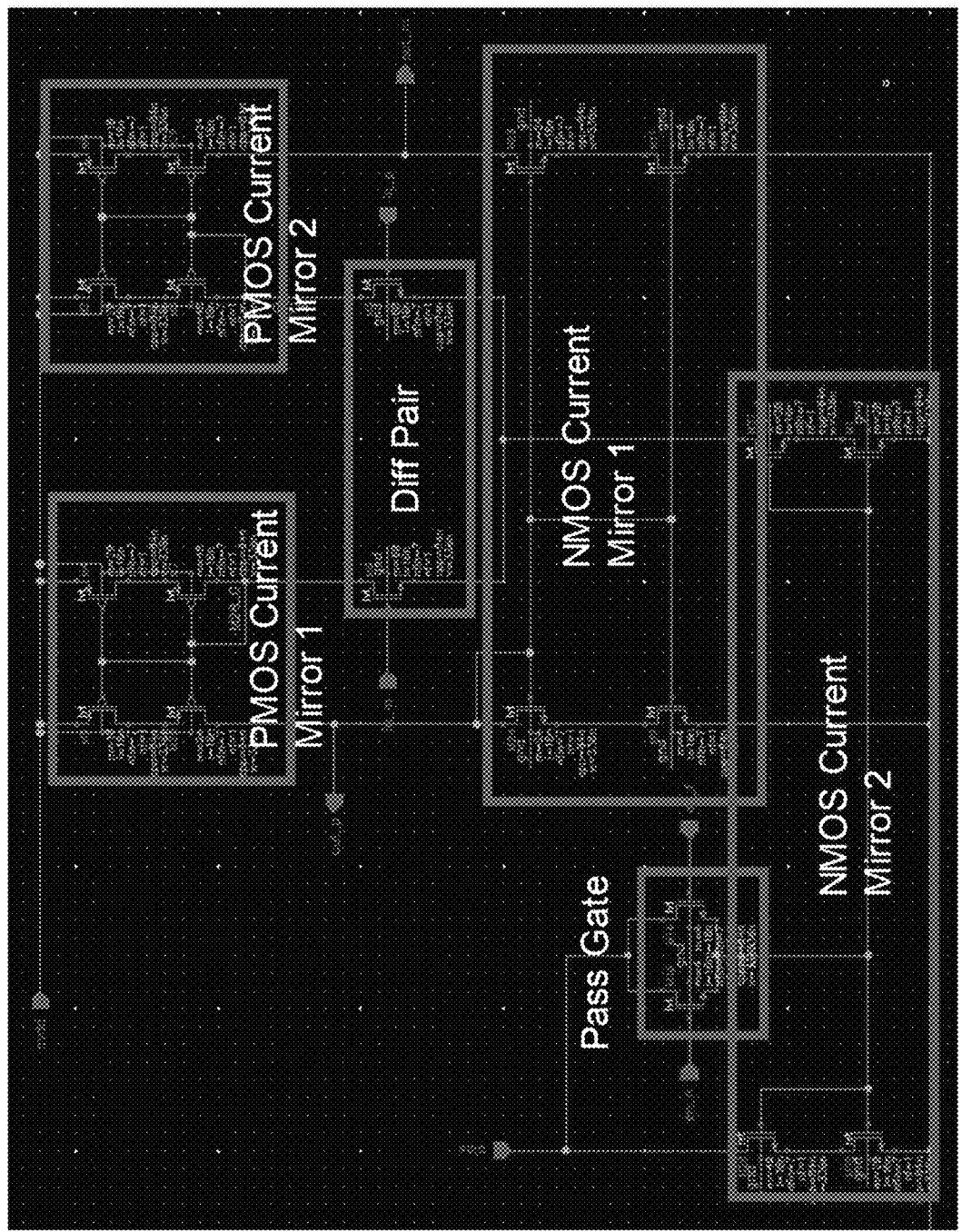
FIG. 19 is a diagram depicting aspects of a machine learning prediction process in accordance with an embodiment of the present disclosure.
Figure 20:
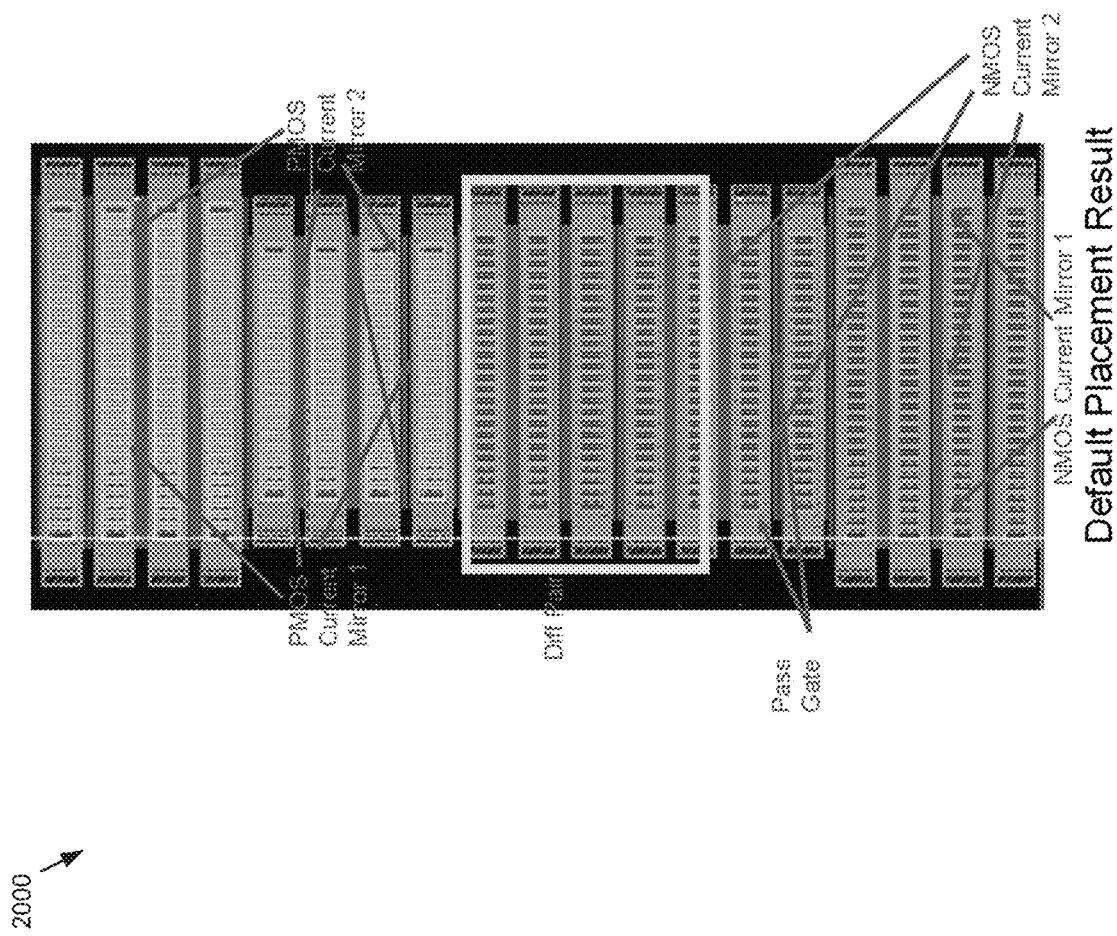
FIG. 20 is a diagram depicting results of a machine learning prediction process in accordance with an embodiment of the present disclosure.
Figure 21:
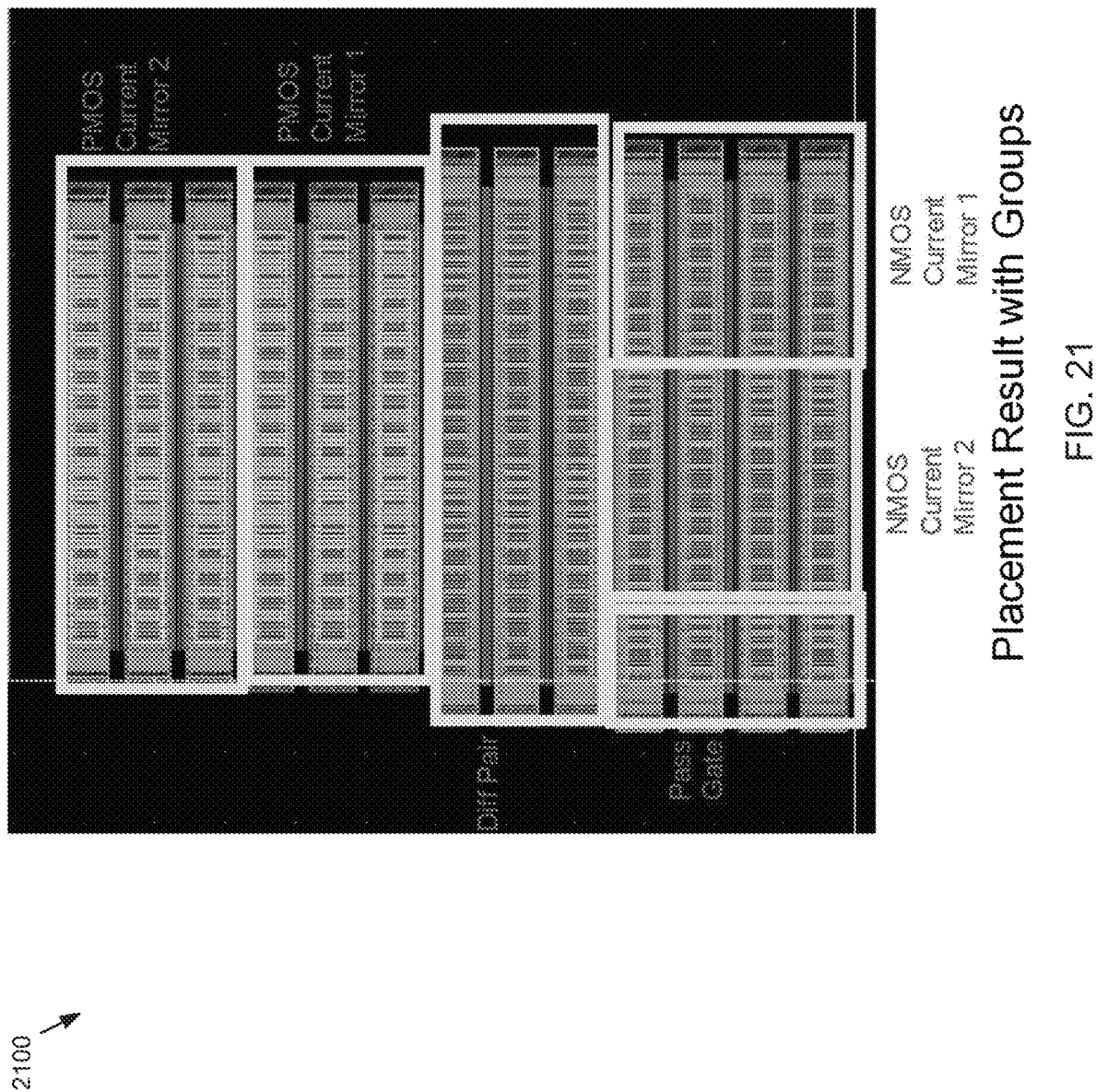
FIG. 21 is a diagram depicting results of a machine learning prediction process in accordance with an embodiment of the present disclosure.
Figure 22:
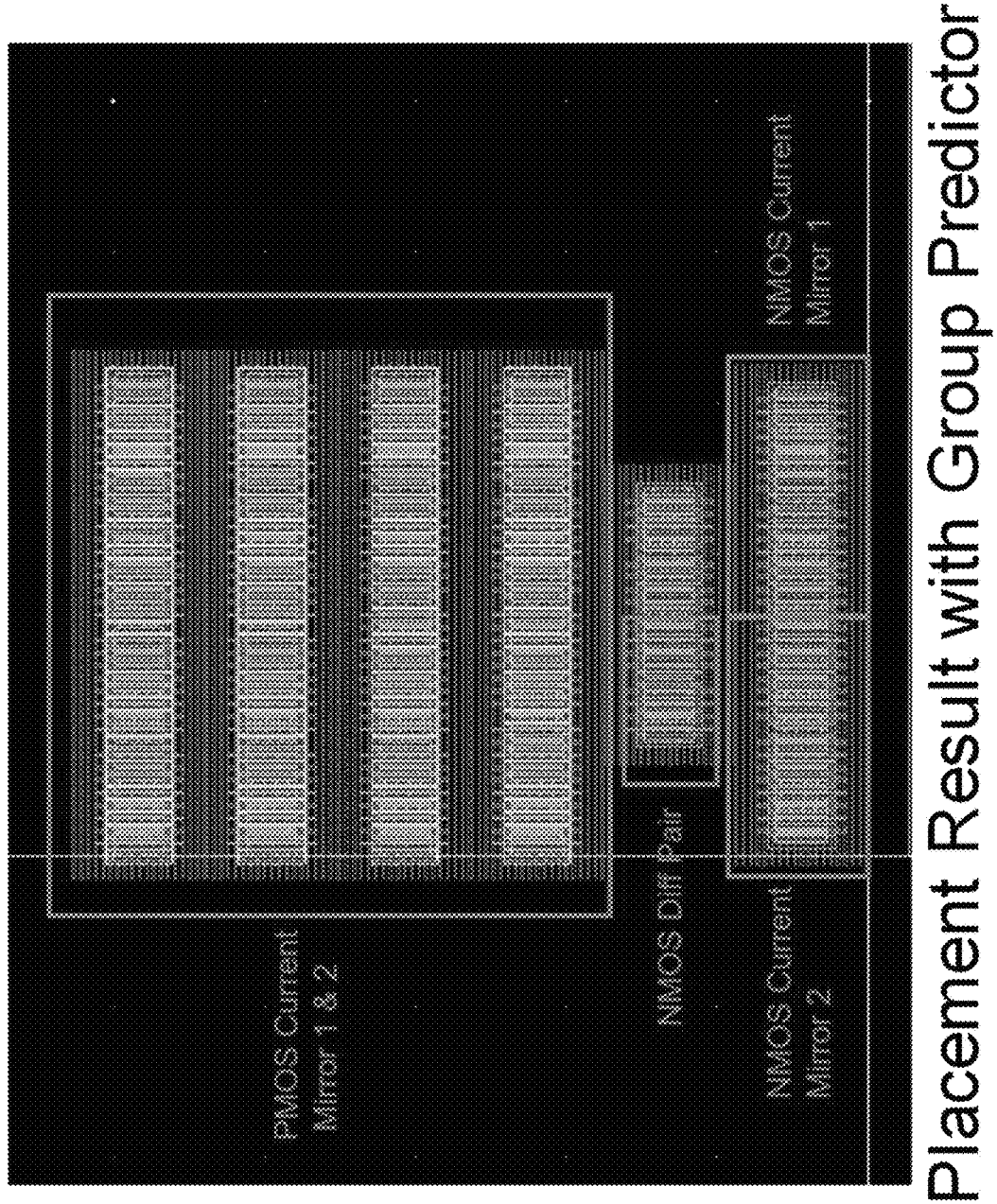
FIG. 22 is a diagram depicting results of a machine learning prediction process in accordance with an embodiment of the present disclosure.
Figure 23:
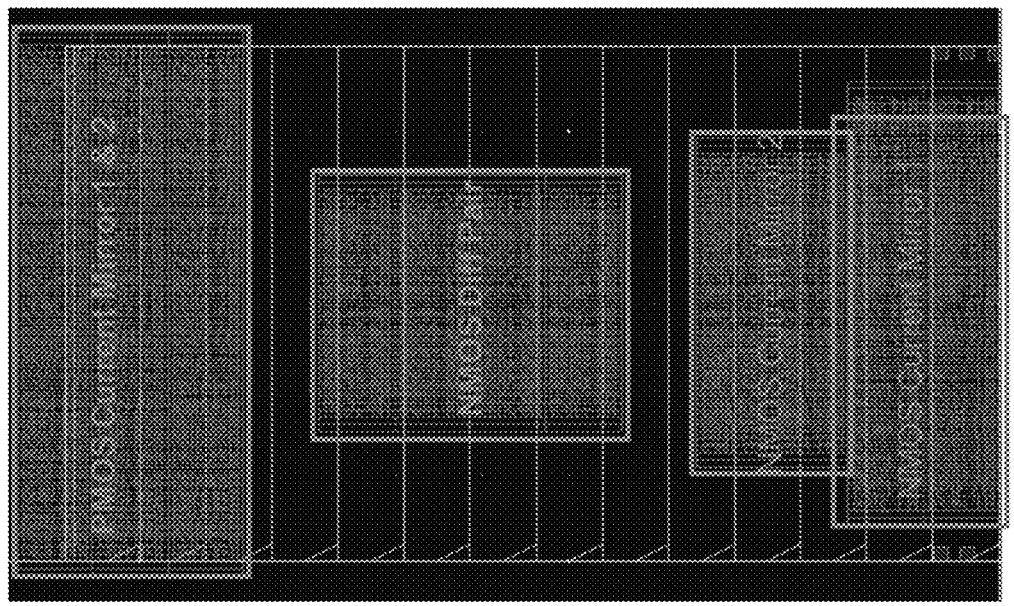
FIG. 23 is a diagram depicting results of a machine learning prediction process in accordance with an embodiment of the present disclosure.
Figure 24:
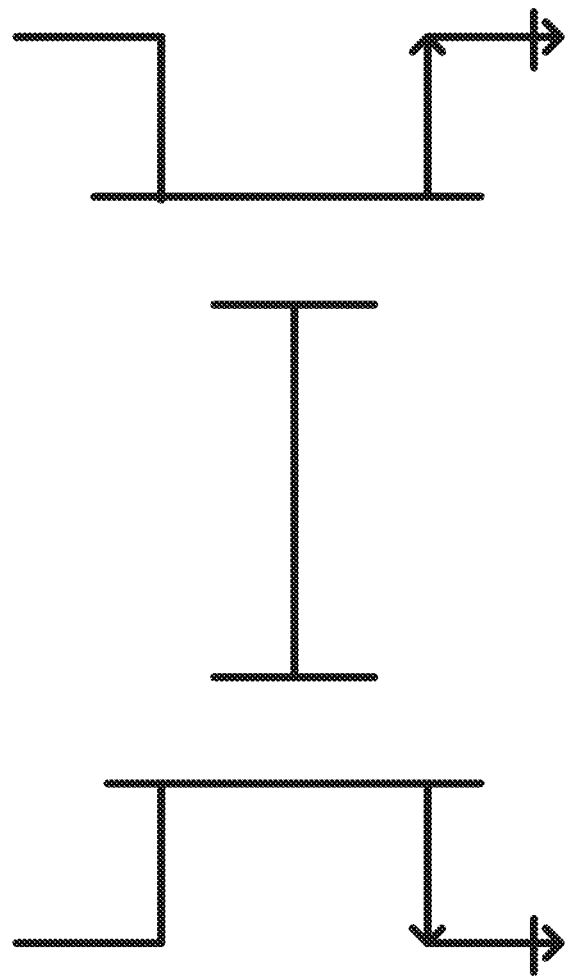
FIG. 24 is a diagram depicting aspects of a probabilistic circuit prospector process in accordance with an embodiment of the present disclosure.
Figure 24:

Referring now to FIG. 19, an example showing results in accordance with embodiments of the present disclosure is provided. In this example, the system may apply a predictor learned from one or more previous designs on a new schematic. Here, six groups were automatically detected and these groups may be provided as hard constraints to the placement tool. FIG. 20 shows a default placement result and FIG. 21 shows a placement result incorporating grouping techniques described herein. As shown in the Figures, the results with grouping are more compact and structurally meaningful, which may lead to better yield/performance and easier adoption by analog designers. FIG. 22 shows placement results with a group predictor. FIG. 23 shows placement results with group and isolated group predictors. Here, it should be noted that placement with an isolated group predictor further isolates the diff pair, which is closer to what an actual designer might do.

Referring now to FIGS. 24-28, embodiments of the present disclosure directed towards a probabilistic circuit prospector process 13 are provided. Many existing systems struggle to identify circuit structures with high accuracy. Accordingly, embodiments included herein may, for each structure, define a set of "required features" and "optional features". As is described in further detail below, required features may select which predictor to use, and the predictor may be calibrated on user data to determine which optional features are needed. The two-stage flow described herein uses both required and optional features and may then train a machine learning predictor on optional features.

It should be noted that embodiments of probabilistic circuit prospector process 13 may differ in some respects from circuit grouping process 10 described above. The analog structure prediction associated with probabilistic circuit prospector process 13 may be used to predict groups, however, it is not necessarily a layout group. Accordingly, being an analog structure does not necessarily mean it is layout group type 1 or 2. In addition, it may be used to infer other properties (such as a matching relationship). In fact, it may refer to a different set of groups, with the group type being the analog structure name (e.g., diff pair, current mirror, etc.). Accordingly, a group may be both (e.g., diff pair, layout group 1), or one of them, or neither of them.

A common way of detecting groups in circuits is to use a circuit prospector such as those available from the subject assignee of the present disclosure. It is very difficult to precisely write a circuit prospector. For example, the device shown in FIG. 24 may be a current mirror because they share Vgs, but it does not have the g1-d1 connection. A very short rule may be used: g1-g2 connection+s1-s2 connection. Additionally and/or alternatively, a very long rule may be used: g1-g2 connection+s1-s2 connection+same device type+same 1+same nfins+same m-factor+schematic same row+s is connected to gnd. When applying the rule to a new schematic a short rule may find too many matches (low precision) and a long rule may find too few matches (low recall).

In some embodiments, probabilistic circuit prospector process 13 may be configured to extend the circuit prospector probabilistically to include a set of required features and optional features. In some embodiments, required features are those that have be satisfied to detect this circuit structure. A machine learning algorithm may be configured to learn which optional features need to be satisfied to confidently predict grouping. For example, for a current mirror, the following features may be required, namely, a G-G connection, S-S connection, same device type, same length (l), S connected to power. The optional features may include same row, same size, same schematic orientation, RO/MY schematic orientation, has G-D connection, size large enough, drawn closely in schematic, etc. In some embodiments, the features may be tuned and/or some features may be given a higher weighting than other features. For example, if using the seven optional features listed above, the presence of four or more of the seven may variations in the analysis and/or the presence of features that have a higher weighting may also alter the end result.

Figure 25:
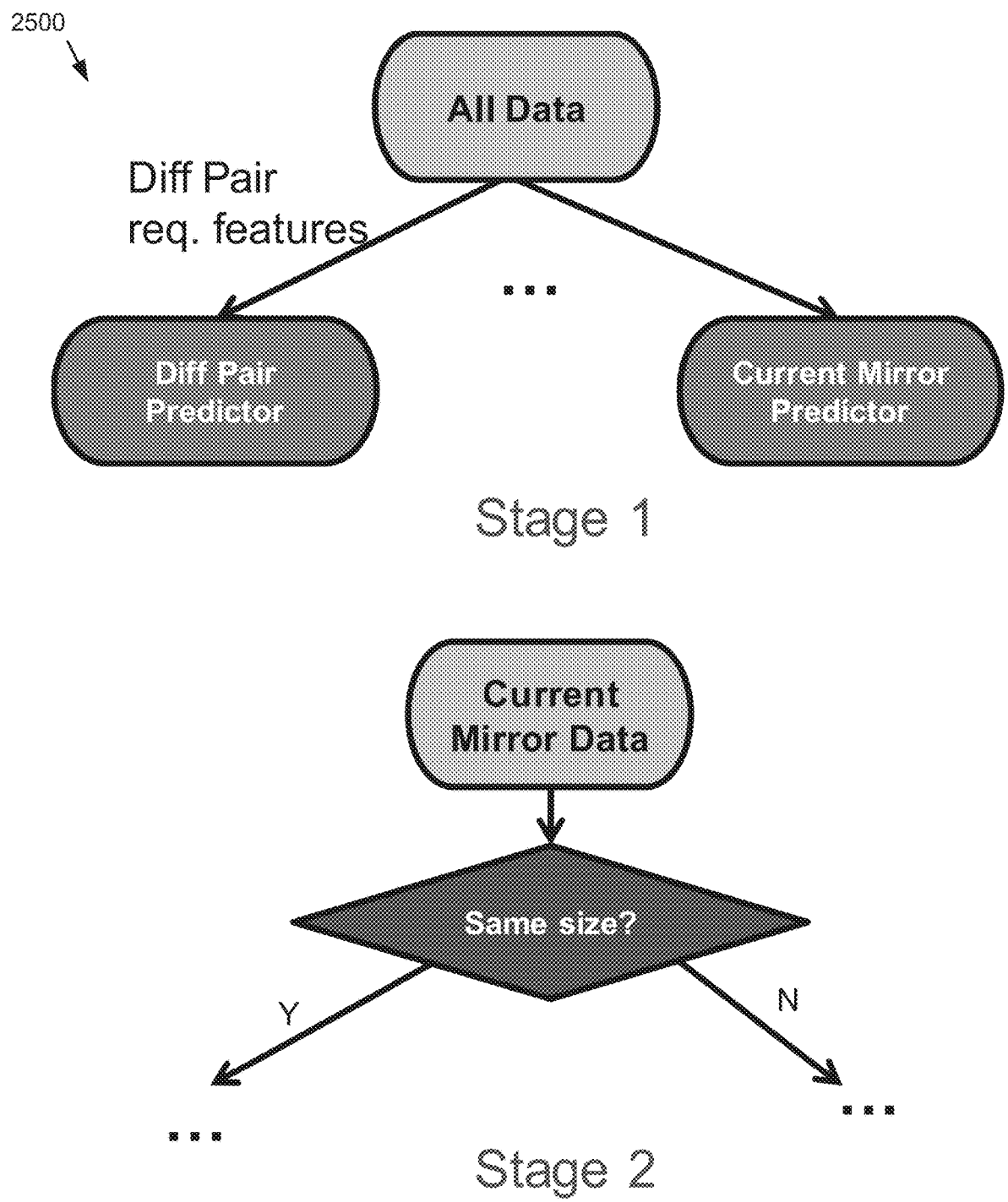
FIG. 25 is a diagram depicting aspects of a probabilistic circuit prospector process in accordance with an embodiment of the present disclosure.
Figure 26:
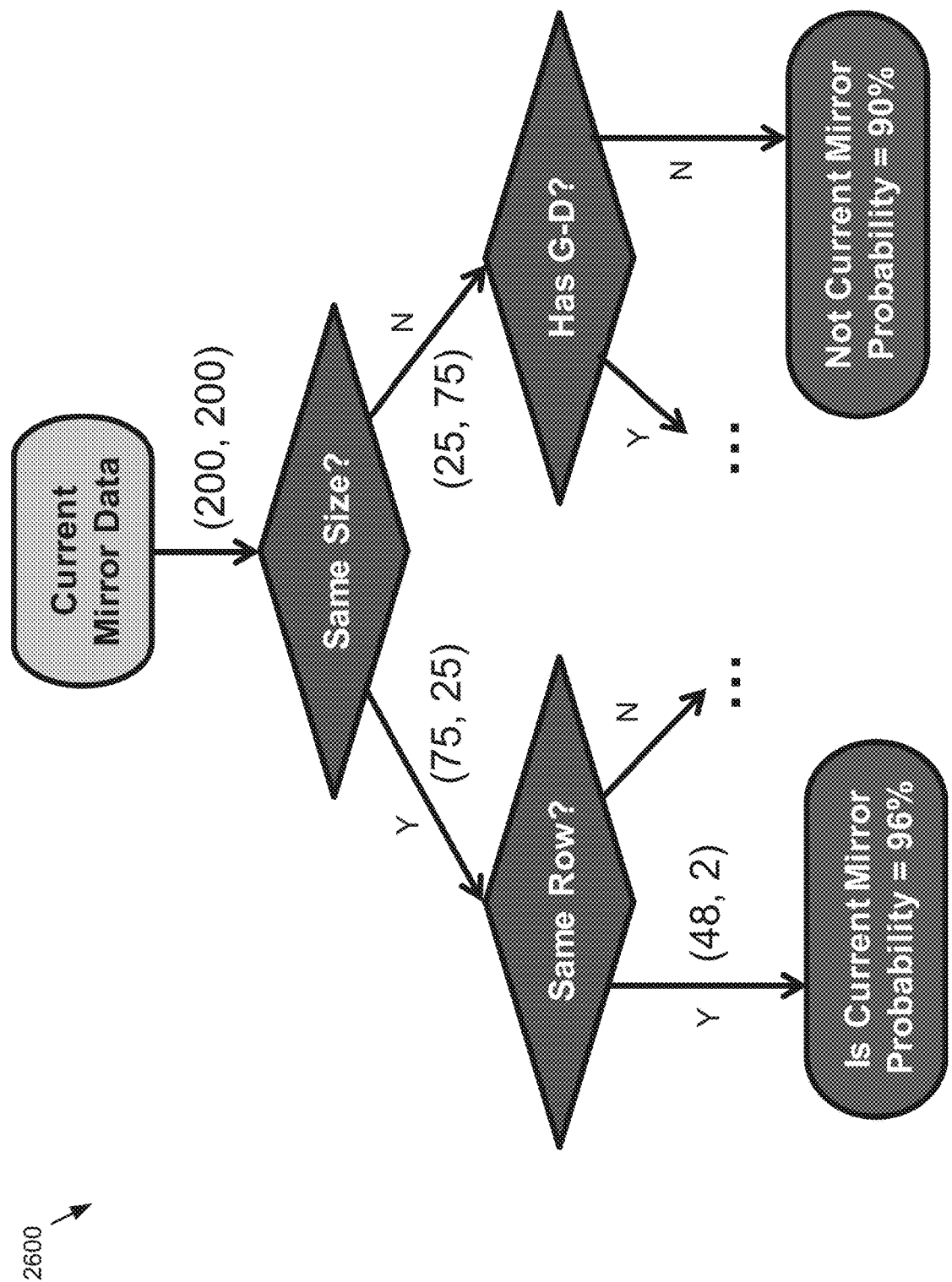
FIG. 26 is a diagram depicting aspects of a probabilistic circuit prospector process in accordance with an embodiment of the present disclosure.

Referring now to FIGS. 25-26, embodiments showing an example probabilistic circuit prospector process is provided. In these figures the current mirror data may be training data. As shown in FIG. 25, a two stage process may be employed. First, probabilistic circuit prospector process 13 may decide which predictor to use based on the required features. The second stage includes deciding. whether it needs to be grouped based on the optional features. In some embodiments, only stage two is a machine learning model and a decision tree may be used as the machine learning model. The tree may be constructed top-down, and each node chooses the question that best splits the data as is shown in FIG. 26. It is very easy to interpret and produces probability directly based on number of training samples. It should be noted that any suitable model may be used, including, but not limited to, logistic regression, etc.

In some embodiments, and in order to limit the model complexity, some embodiments require every feature in the decision tree to be a binary feature. For example, instead of using schematic position difference, which is a floating point number, some embodiments use the feature "are they close in schematic", which is a binary feature. This may require transforming the non-binary features to binary features. The transformation may be performed similar to the idea of determining the threshold in decision tree.

Figure 27:
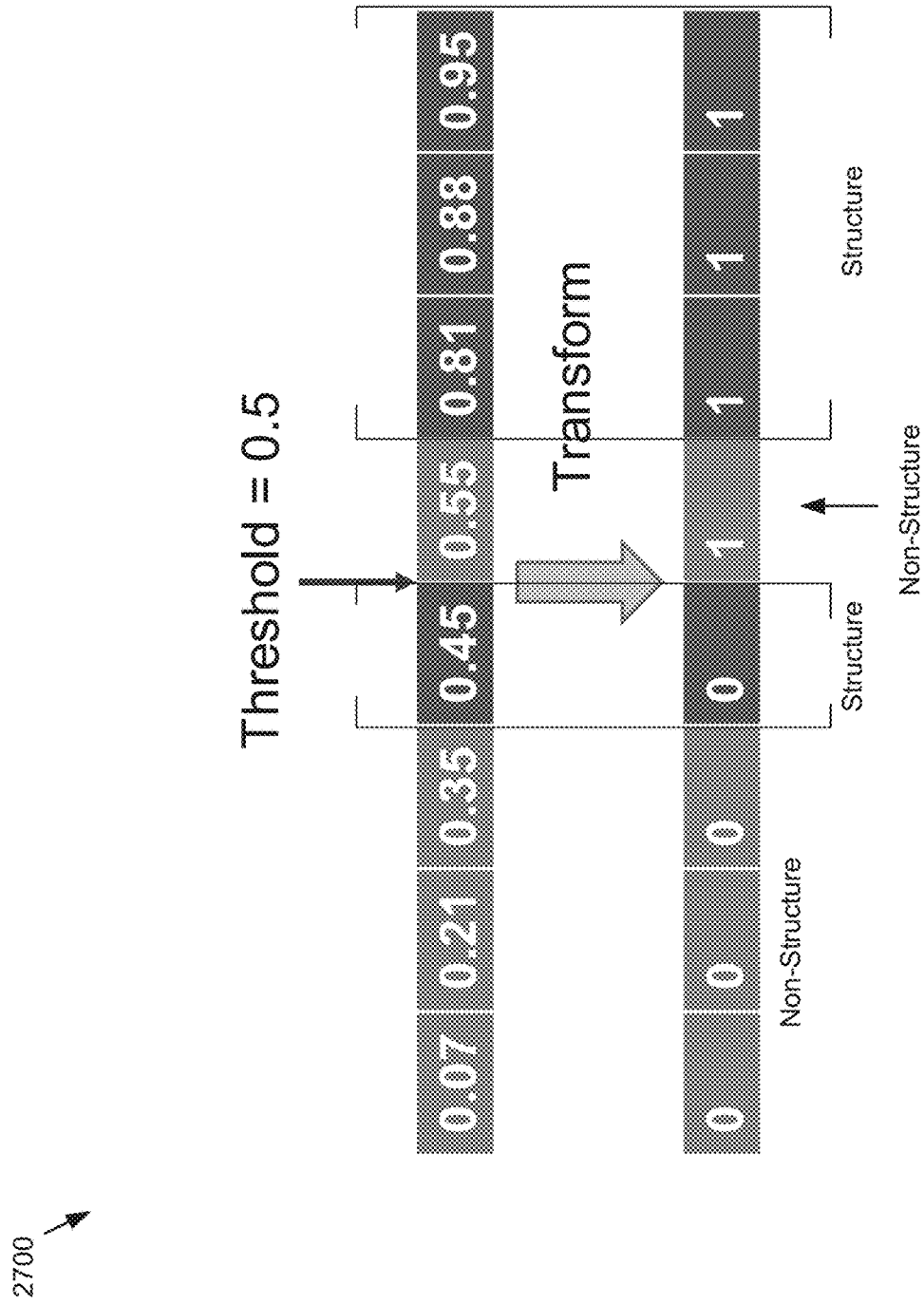
FIG. 27 is a diagram depicting aspects of a probabilistic circuit prospector process in accordance with an embodiment of the present disclosure.

In operation, and referring now to FIG. 27, embodiments included herein may sort all values for the features and record the class label related to each value. The process may then generate all possible thresholds by averaging all adjacent numbers. And, for each threshold, both transforming the feature by setting all values below threshold to 0, all values above threshold to 1 and calculating the gini impurity for this transformation. The process may then set the threshold to the one with smallest gini impurity and then perform the transformation using the threshold.

In some embodiments, a cross validation approach may be utilized. For example, rather than merely listing all optional features, embodiments included herein may also determine an empirical order of the optional features. This may reflect our prior belief of relative importance of features without any data. In some embodiments, the decision tree may be built using two hyperparameters, M and D. M indicates that only the first M features are used to build the tree, where D indicates the height of the tree cannot exceed D. The optimal values of M and D may be determined using cross validation.

Referring now to FIG. 28, a table showing results obtained using embodiments of the present disclosure is provided. Here, a layout group label was used to calibrate the probabilistic circuit prospector. The understanding here is that if it is a valid structure the layout designer will likely group it. Two probabilistic circuit prospector predictors were implemented, a diff pair and a current mirror. Experiments were performed by cross-validation on sixteen electronic circuit designs. Using the teachings of the present disclosure (e.g. probabilistic circuit prospector) similar or better accuracy was achieved in all cases.

In some embodiments, the present disclosure may include an automatic sizing constraint generation process 15 by reusing existing designs. Accordingly, the process 15 may be configured to automatically create these constraints by learning from existing designs. Circuit sizing is a step in the design flow that may be performed before any layout is available (e.g., before placement). In circuit sizing, a circuit topology may be provided, and it may be necessary to adjust the size of all devices so that the circuit achieves best performance. Before running circuit sizing, embodiments included herein may need to set up the proper sizing constraints (which sizing parameters on which devices are allowed to vary, with what range).

In some embodiments, automatic sizing constraint generation process 15 may use one or more machine learning predictors and may integrate with aspects of circuit grouping process 10 and/or probabilistic circuit prospector process 13 to predict matching constraints. It should be noted that while automatic sizing constraint generation process 15 may be an application of probabilistic circuit prospector process 13 this is provided merely by way of example and is not intended to be the only application of that process.

In existing systems, prior to running circuit optimization, the circuit parameters, the range of the parameters, and their matching relationship must be manually specified. Accordingly, embodiments of the present disclosure may provide for the automatic recognition of tunable variables and ranges as well as the ability to learn the matching relationship of structures. As such, embodiments included herein may be configured to combine user-defined methodology, machine learning structure predictors and several new predictors.

In some embodiments, automatic sizing constraint generation process 15 may apply optimization to automatically tune the device size parameters to meet circuit specifications. Before running an automatic sizing algorithms, sizing constraints need to be created to specify which parameters can be tuned, the range of parameters, and/or the matching relationship of parameters. Embodiments included herein may be configured to automatically create these constraints, assuming a set of related circuits with completed sizing and layout are available as training data. As will be discussed in further detail below, the process may learn from customer data or from a configuration file. If the configuration file is selected it may, in some cases, override the machine learning process.

In some embodiments, some of the sizing constraints may be related to design methodology decisions that are specific to the new design being sized, and should not be learned from the training data. For example, the new design may require a fixed number of fins, but such a restriction does not exist in training data. Or the training data may even come from a different developer kit, where it is still possible to learn the matching relationship, but not other configurations. The user or customer may optionally provide a methodology configuration file which specifies some of these settings. If a setting exists in the methodology file, it may override the setting automatically learned from training data.

In some embodiments, automatic sizing constraint generation process 15 may automatically learn parameters and ranges requires going through the training data once for each (device type, parameter) combination, record all values that occurred in training data, if all values are the same, record the parameter as a fixed parameter, otherwise record the possible values of the parameter. Alternatively, these settings may be specified in the configuration file by the customer. An example is provided below:

<device>nmos_1v
  <parameter>m
    <value>1 2 3 4 5</value>

</device>

In some embodiments, generating a matching relationship requires one or more steps. First, may include finding the analog structures and second may include applying the matching relationship for the analog structure. The output of the first step is a list of device groups and their corresponding structure name, for example:

(M1, M2): Diff pair
(M3, M4, M5): Current Mirror

These structures may be found by applying a machine learning predictor trained on existing designs as is discussed below.

In some embodiments, multiple machine learning predictors can potentially be used. For example, a probabilistic circuit prospector may be used where the output includes both the groups and structure name, as such, it may be directly applied. An optional approach may include using a group predictor where the output only contains the groups but group type is unknown. One possible example for automatically locating group types may include a training stage and an inference stage. The training stage may include training a group predictor on existing data and performing clustering using connectivity features on groups. The group type is the cluster name (e.g., cluster 1, cluster2, . . . ). The inference stage may include applying a group predictor to identify groups and assigning the group type as the nearest cluster in connectivity.

In some embodiments, automatic sizing constraint generation process 15 may include learning and generating a matching relationship. Accordingly, automatically learning matching may include parsing the training data once for each (group type, parameter) combination and subsequently recording all parameter ratios that occurred in training data. If all parameter pairs within the same group have the same value, or the percentage of parameter pairs having the same value is greater than a threshold, record this parameter as a matched parameter. Otherwise, record the parameter as a ratioed parameter and record the possible ratios.

In some embodiments, generating matching constraints may be performed using the following steps:
For each pair (A,B) in a group:
  Get group type t
  For each parameter p:
    If parameter p is a matched parameter for type t:
      Create match constraint: A.p=B.p
    If parameter p is a ratioed parameter for type t:
      Create a new variable $ratio_{ABp}$ and initialize it with recorded possible values
      Create ratio constraint: A.p=$ratio_{ABp}$*B.p In some embodiments, generating a matching relationship may be achieved using a file. Accordingly, these settings may be specified in the configuration file, for example:
<group>Current Mirror
  <finder>_func1<finder>
  <parameter>m
    <ratio>1 2 3 4 5</ratio>

<parameter>l
    <ratio>1</ratio>

</group>

The "finder" may be an optional function that overrides the machine learning predictor, if specified. The term "finder" generally refers to a hand-written function that inspects the properties of devices and determines if they belong to the group, as opposed to relying on a machine learning model. Each parameter may include an optional ratio. If the ratio is 1 it indicates that the parameter needs to be matched.

In some embodiments, the training stage may include learning the parameters to tune and their ranges from existing designs. Training may also include learning one or more structure predictors from existing designs and learning one or more matching relationships from existing designs. The inference stage may include for each device, setting the parameters to tune and their ranges based on a configuration file or training data. The inference stage may also include applying a machine learning predictor or manually written function in the configuration file to identify structures. For each structure, the process may include setting constraints on its parameters based on the configuration file of training data.

It should be noted that although certain embodiments included herein may reference machine learning or genetic algorithms, any analysis process may be used in accordance with the teachings of the present disclosure. For example, any evolutionary algorithm, genetic algorithm, genetic program, grouping genetic algorithm, evolutionary computing approach, metaheuristics, stochastic optimization, optimization approach, artificial intelligence technique, etc. may be used without departing from the teachings of the present disclosure.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic design comprising:
receiving, using at least one processor, an electronic design schematic and an electronic design layout;
analyzing, via machine learning, at least one schematic feature from a pair of devices associated with the electronic design schematic using a pairwise classification technique wherein the at least one schematic feature includes a device size, a device schematic position, and a device schematic orientation; and
determining, based, at least in part, upon the analyzing, whether the pair of devices should be grouped together in an electronic design.

2. The computer-implemented method for electronic design of claim 1, wherein determining includes determining whether the pair of devices should be grouped together as a first group type or a second group type.

3. The computer-implemented method for electronic design of claim 1, further comprising:
grouping the pair of devices together.

4. The computer-implemented method for electronic design of claim 1, wherein analyzing includes analyzing a plurality of pairs of devices and determining whether two or more of the plurality of device pairs should be grouped.

5. The computer-implemented method for electronic design of claim 4, further comprising:
clustering the two or more of the plurality of device pairs as a clustered group containing more than two devices.

6. The computer-implemented method for electronic design of claim 1, wherein the at least one schematic feature further includes one or more of a device type or a device connectivity.

7. The computer-implemented method for electronic design of claim 1, wherein analyzing includes applying a decision tree based classifier to the at least one schematic feature.

8. The computer-implemented method for electronic design of claim 1, wherein determining includes determining whether the pair should be included as an isolated group.

9. The computer-implemented method for electronic design of claim 8, wherein determining is based upon, at least in part, whether the pair is associated with a known structure.

10. A computer-readable storage medium having stored thereon instructions, which when executed by a processor result in one of more operations for electronic design, the operations comprising:
receiving, using at least one processor, an electronic design schematic and an electronic design layout;
analyzing, via machine learning, at least one schematic feature from a pair of devices associated with the electronic design schematic using a pairwise classification technique, wherein the at least one schematic feature includes a device size, a device schematic position, and a device schematic orientation; and
determining, based, at least in part, upon the analyzing, whether the pair of devices should be grouped together in an electronic design.

11. The computer-readable storage medium of claim 10, wherein determining includes determining whether the pair of devices should be grouped together as a first group type or a second group type.

12. The computer-readable storage medium of claim 10, further comprising:

grouping the pair of devices together.

13. The computer-readable storage medium of claim 10, wherein analyzing includes analyzing a plurality of pairs of devices and determining whether two or more of the plurality of device pairs should be grouped.

14. The computer-readable storage medium of claim 13, further comprising:

clustering the two or more of the plurality of device pairs as a clustered group containing more than two devices.

15. The computer-readable storage medium of claim 10, wherein the at least one schematic feature further includes one or more of a device type or a device connectivity.

16. The computer-readable storage medium of claim 10, wherein analyzing includes applying a decision tree based classifier to the at least one schematic feature.

17. The computer-readable storage medium of claim 10, wherein determining includes determining whether the pair should be included as an isolated group.

18. The computer-readable storage medium of claim 17, wherein determining is based upon, at least in part, whether the pair is associated with a known structure.

19. A computing system including one or more processors and one or more memories configured to perform operations comprising:

receiving, using at least one processor, an electronic design schematic and an electronic design layout;

analyzing, via machine learning, at least one schematic feature from a pair of devices associated with the electronic design schematic using a pairwise classification technique, wherein the at least one schematic feature includes a device size, a device schematic position, and a device schematic orientation; and determining, based, at least in part, upon the analyzing, whether the pair of devices should be grouped together in an electronic design.

20. The computing system of claim 19, wherein determining includes determining whether the pair of devices should be grouped together as a first group type or a second group type.

* * * * *